(12) United States Patent
Steadman Booker et al.

(10) Patent No.: US 12,726,204 B2
(45) Date of Patent: Sep. 1, 2026

(54) METHOD FOR OPERATING A CIRCUIT ARRANGEMENT AND CIRCUIT ARRANGEMENT

(71) Applicant: ams International AG, Jona (CH)

(72) Inventors: Roger Steadman Booker, Aachen (DE); Fridolin Michel, Au (CH)

(73) Assignee: AMS INTERNATIONAL AG, Jona (CH)

( * ) Notice: Subject to any disclaimer, the term of this patent is extended or adjusted under 35 U.S.C. 154(b) by 58 days.

(21) Appl. No.: 18/717,452

(22) PCT Filed: Oct. 26, 2022

(86) PCT No.: PCT/EP2022/079924
§ 371 (c)(1),
(2) Date: Jun. 7, 2024

(87) PCT Pub. No.: WO2023/104387
PCT Pub. Date: Jun. 15, 2023

(65) Prior Publication Data

US 2025/0015806 A1 Jan. 9, 2025

(30) Foreign Application Priority Data

Dec. 9, 2021 (EP) .................................... 21213280

(51) Int. Cl.
*H03K 5/00* (2006.01)
*H03K 5/24* (2006.01)
*H03K 21/08* (2006.01)

(52) U.S. Cl.
CPC ............... *H03K 21/08* (2013.01); *H03K 5/24* (2013.01)

(58) Field of Classification Search
CPC . H03K 21/08; H03K 5/24; G01T 1/40; G01T 1/171
See application file for complete search history.

(56) References Cited

U.S. PATENT DOCUMENTS 7,943,907 B2 5/2011 Eversmann et al.
10,098,595 B2 * 10/2018 Surendranath ....... A61B 6/4208
(Continued)

FOREIGN PATENT DOCUMENTS

EP 2734861 B1 5/2014

OTHER PUBLICATIONS

International Search Report for corresponding International patent application No. PCT/EP2022/079924, dated Jan. 24, 2023, 4 pages.
(Continued)

*Primary Examiner* — Tuan T Lam
(74) *Attorney, Agent, or Firm* — VIERING, JENTSCHURA & PARTNER mbB

(57) ABSTRACT

A circuit arrangement and method for operating such is provided. The method includes receiving a voltage signal with a voltage level (IVL) by first and second comparators, comparing the IVL to a first voltage level (FVL), comparing the IVL to a second voltage level (SVL), incrementing a first counter assigned to the first comparator once the IVL is higher than the FVL, incrementing the first counter again after the IVL being lower and higher again than the FVL, incrementing a second counter assigned to the second comparator once the IVL is higher than the SVL, incrementing the second counter again after the IVL being lower and higher again than the SVL, and incrementing the first counter again once the second counter was incremented twice without the first counter being incremented in between, wherein the absolute value of the FVL is lower than the absolute value of the SVL.

8 Claims, 13 Drawing Sheets

(56) References Cited

U.S. PATENT DOCUMENTS

2010/0270472 A1* 10/2010 Proksa .................... G01T 1/171 250/336.1
2014/0334600 A1* 11/2014 Lee ...................... A61B 6/4241 250/336.1
2015/0257722 A1* 9/2015 Wang .................... G01T 1/2985 250/336.1
2020/0064500 A1* 2/2020 Steadman Booker ....................... H03K 5/1532
2023/0138853 A1* 5/2023 Taguchi ................ G01T 1/2985 250/369
2024/0195431 A1* 6/2024 Rigo ..................... H03M 1/682

OTHER PUBLICATIONS

Kappler, S. et al., "Quantum-counting CT in the regime of count-rate paralysis: intrduction of the pile-up trigger method", Medical Imaging 2011: Physics of Medical Imaging, vol. 7961, 2011, 11 pages.

* cited by examiner

METHOD FOR OPERATING A CIRCUIT ARRANGEMENT AND CIRCUIT ARRANGEMENT

CROSS-REFERENCE TO RELATED APPLICATIONS

This application is a 371 U.S. National Phase of PCT International Patent Application No. PCT/EP2022/079924, filed on Oct. 26, 2022, which claims priority from EP patent application Ser. No. 21/213,280.7, filed on Dec. 9, 2021, the disclosures of which are incorporated by reference herein in their entirety for all purposes.

TECHNICAL FIELD

A method for operating a circuit arrangement and a circuit arrangement are provided.

BRIEF SUMMARY

Photon counting detectors are usually characterized by their capacity to resolve the incident x-ray flux. Due to the random nature of the arrival times of x-ray photons, photon counting detectors have a nonlinear response to incident flux. The characteristic response can generally be approximated to two different models, the so-called paralyzable model and non-paralyzable model. In the paralyzable model, the number of counts registered by the detector does not follow a monotonic response, resulting in an ambiguous mapping of the observed count-rate in relation to the impinging rate. On the other hand, non-paralyzable detectors offer a monotonic response, albeit not linear. Essentially, both models contain the same information and can be employed in spectral computed tomography (CT). Non-paralyzable solutions are often preferred due to a simplified linearization during system calibration.

Whether a detector follows either of those models, depends on the architecture of the front-end electronics. Linear time-invariant implementations usually result in paralyzable models. Non-paralyzable front-ends usually require some time-variant response (e.g. a reset scheme), which can contribute to additional non-ideal artefacts as charge loss, energy errors or noise.

It is an objective to provide a method for operating a circuit arrangement with an improved accuracy. It is further an objective to provide a circuit arrangement that can be operated with an improved accuracy.

These objectives are achieved by the subject matter of the independent claims. Further developments and embodiments are described in dependent claims.

According to at least one embodiment of the method for operating a circuit arrangement, the method includes receiving an input voltage signal with an input voltage level by at least one first comparator and by at least one second comparator. This means, the first comparator receives the input voltage signal and the second comparator receives the input voltage signal. The input voltage signal can be a signal which changes with time. The input voltage signal can have an amplitude which changes with time. The amplitude of the input voltage signal be the input voltage level. The input voltage level can be the absolute value of the amplitude of the input voltage signal. Thus, also the input voltage level changes with time. The first comparator and the second comparator can receive the input voltage signal continuously and/or over a certain period of time.

According to at least one embodiment of the method, the method includes comparing the input voltage level to a first voltage level by the first comparator. This means, the first comparator compares the input voltage level to the first voltage level. The first comparator can compare the input voltage level to the first voltage level at different points in time. The first voltage level is a predefined value. The absolute value of the first voltage level can be smaller than the absolute value of an expected voltage level. The expected voltage level can relate to the energy of a photon detected by a photon detector.

According to at least one embodiment of the method, the method includes comparing the input voltage level to a second voltage level by the second comparator. This means, the second comparator compares the input voltage level to the second voltage level. The second comparator can compare the input voltage level to the second voltage level at different points in time. The second voltage level is a predefined value. The absolute value of the second voltage level can be smaller than the absolute value of an expected voltage level. The expected voltage level can relate to the energy of a photon detected by a photon detector.

According to at least one embodiment of the method, the method includes incrementing a first counter assigned to the first comparator once the input voltage level is higher than the first voltage level. The term "higher" here and in the following refers to a comparison of absolute values. The first counter can be connected with the first comparator. The first counter can be incremented once the input voltage level is higher than the absolute value of the first voltage level. The first counter can be incremented by 1, by at least 1 or by more than 1 once the input voltage level is higher than the first voltage level. The first counter can be incremented as soon as the first comparator detects that the input voltage level is higher than the first voltage level. It is possible that the first counter is only incremented again under certain conditions. This means, if the first comparator detects that the input voltage level is higher than the first voltage level at a first point in time the first counter is not necessarily incremented again if the first comparator detects for a second point in time following directly after the first point in time that the input voltage level is still higher than the first voltage level.

According to at least one embodiment of the method, the method includes incrementing the first counter again after the input voltage level being lower and higher again than the first voltage level. The first counter can be incremented by 1, by at least 1 or by more than 1 after the input voltage level being lower and higher again than the first voltage level. This can mean, that the first counter is incremented each time that the first comparator detects that the input voltage level increased over the first voltage level. A first discriminator can be comprised by the first comparator. The first discriminator can be switched from an inactive state to an active state once the input voltage level is higher than the first voltage level. With the first discriminator being switched into the active state, the first counter is incremented. It is possible that the first counter is incremented again after the first discriminator was switched into the inactive state. It is possible that the first discriminator is switched into the inactive state once the input voltage level is lower than the first voltage level. The first discriminator can be switched into the active state again once the input voltage level is higher again than the first voltage level.

According to at least one embodiment of the method, the method includes incrementing a second counter assigned to the second comparator once the input voltage level is higher than the second voltage level. The second counter can be connected with the second comparator. The second counter can be incremented once the input voltage level is higher than the absolute value of the second voltage level. The second counter can be incremented by 1, by at least 1 or by more than 1 once the input voltage level is higher than the second voltage level. The second counter can be incremented as soon as the second comparator detects that the input voltage level is higher than the second voltage level. It is possible that the second counter is only incremented again under certain conditions. This means, if the second comparator detects that the input voltage level is higher than the second voltage level at a first point in time the second counter is not necessarily incremented again if the second comparator detects for a second point in time following directly after the first point in time that the input voltage level is still higher than the second voltage level.

According to at least one embodiment of the method, the method includes incrementing the second counter again after the input voltage level being lower and higher again than the second voltage level. The second counter can be incremented by 1, by at least 1 or by more than 1 after the input voltage level being lower and higher again than the second voltage level. This can mean, that the second counter is incremented each time that the second comparator detects that the input voltage level increases over the second voltage level. A second discriminator can be comprised by the second comparator. The second discriminator can be switched from an inactive state to an active state once the input voltage level is higher than the second voltage level. With the second discriminator being switched into the active state, the second counter is incremented. It is possible that the second counter is incremented again after the second discriminator was switched into the inactive state. It is possible that the second discriminator is switched into the inactive state once the input voltage level is lower than the second voltage level. The second discriminator can be switched into the active state again once the input voltage level is higher again than the second voltage level.

According to at least one embodiment of the method, the method includes incrementing the first counter again once the second counter was incremented twice without the first counter being incremented in between. The first counter can be incremented by at least 1 again once the second counter was incremented twice without the first counter being incremented in between. This means, the second counter was incremented twice and the first counter was not incremented between these two times of the second counter being incremented. Between these two times that the second counter was incremented the input voltage level was not lower than the first voltage level. Thus, the first discriminator did not return into the inactive state. Therefore, the first counter was not incremented again between these two times that the second counter was incremented. Between these two times that the second counter was incremented, the input voltage level was below the second voltage level and above the second voltage level again. Once the input voltage level was higher than the second voltage level again, the second counter was incremented for the second time. This means, that the input voltage level only dropped below the second voltage level between these two times that the second counter was incremented but not below the first voltage level.

According to at least one embodiment of the method, the absolute value of the first voltage level is lower than the absolute value of the second voltage level.

According to at least one embodiment of the method, the method includes receiving an input voltage signal with an input voltage level by at least one first comparator and by at least one second comparator, comparing the input voltage level to a first voltage level by the first comparator, comparing the input voltage level to a second voltage level by the second comparator, incrementing a first counter assigned to the first comparator once the input voltage level is higher than the first voltage level, incrementing the first counter again after the input voltage level being lower and higher again than the first voltage level, incrementing a second counter assigned to the second comparator once the input voltage level is higher than the second voltage level, incrementing the second counter again after the input voltage level being lower and higher again than the second voltage level, and incrementing the first counter again once the second counter was incremented twice without the first counter being incremented in between, wherein the absolute value of the first voltage level is lower than the absolute value of the second voltage level.

An idea underlying the method for operating a circuit arrangement is to improve the accuracy of detecting voltage pulses in the input voltage signal. It is furthermore possible to improve the accuracy of detecting the amplitude of the voltage pulses in the input voltage signal. The input voltage signal can be a superposition of a plurality of voltage pulses. The voltage pulses can be provided by a frontend circuit that is configured to convert current pulses into voltage pulses. The frontend circuit can receive current pulses from a photon detector, as for example employed in computed tomography (CT). In order to analyze the signals detected by the photon detector it is necessary to determine how many current pulses of which energy are generated by the photon detector. This can be achieved by counting the number of voltage pulses provided per time by the frontend circuit for different energy ranges, this means for different voltage ranges. This counting can be carried out by employing the comparators and the counters.

Errors can arise in this counting for the case that two or more voltage pulses provided by the frontend circuit overlap with each other. This means, two or more voltage pulses pile up on each other. This makes it more difficult to differentiate between different voltage pulses.

By employing the method described herein errors in the counting due to an overlap of voltage pulses are avoided or reduced. If for example a first voltage pulse has an amplitude that is higher than the first voltage level and the second voltage level, this means the input voltage level is higher than the first voltage level and the second voltage level, both the first counter and the second counter are incremented. If a second voltage pulse piles up on the first voltage pulse, a situation is possible where the second discriminator returns into the inactive state since the input voltage level drops below the second voltage level between the first voltage pulse and the second voltage pulse but the first discriminator does not return to the inactive state since the input voltage level does not drop below the first voltage level between the two voltage pulses. In this case, the second voltage pulse with an amplitude that is higher than the first voltage level would not be counted by the first counter. However, according to the method described herein, the first counter is incremented in this situation. Thus, the method takes into account that voltage pulses can overlap with each other. The result of the counting is more accurate than for the case that the first counter is not incremented again between the first voltage pulse and the second voltage pulse.

The method described herein also enables a non-paralyzable count rate response while using inherently paralyzable frontend circuits. This is achieved with the increased accuracy of the method. In a certain range of the rate of voltage pulses the method leads to an improved accuracy in counting. This has the effect that in the diagram where the measured count rate is plotted over the actual rate of pulses, for the paralyzable behavior of the response the point where the curve drops again is shifted towards higher rates of the actual rate of pulses. This means, the range of the actual count rate of pulses within which the curve shows a non-paralyzable behavior extends up to higher rates of the actual count rate of pulses for the method described herein. The method can be employed in spectral CT where the rate of incoming photons is not expected to be higher than a certain threshold, as for example 250 million counts per second per pixel. For spectral CT it is thus sufficient if a count rate response shows a non-paralyzable behavior up to this range which can be achieved by the method described herein. Furthermore, for the method described herein the shape of the curve showing the count rate response can have a steep slope and be more linear up to higher actual rates of pulses. Thus, the count rate can be determined with an increased sensitivity.

The method furthermore has the advantage that not for all embodiments a high-speed clock is required.

According to at least one embodiment of the method, the input voltage signal is also received by one or more further comparators that have different further voltage levels. Each further comparator is assigned to a further counter. The further comparator or the further comparators can work in the same way as the first comparator, with the only difference that the further comparator has a further voltage level or the further comparators have different further voltage levels. The further counter or the further counters can work in the same way as the first counter. The steps of the method can in an analog way also be carried out for the further comparator or the further comparators. The absolute value of the further voltage level or the further voltage levels can be different from the absolute value of the first voltage level. The absolute value of the further voltage level or the further voltage levels can be different from the absolute value of the second voltage level. The absolute value of the further voltage level or the further voltage levels can be higher than the absolute value of the first voltage level and lower than the absolute value of the second voltage level. Employing more than two comparators and more than two counters increases the accuracy of determining a count rate since it can be differentiated between more different voltage levels.

The circuit arrangement can be a circuit arrangement for photon counting. Thus, the method for operating a circuit arrangement can be a method for operating a circuit arrangement for photon counting.

According to at least one embodiment of the method, the first counter is incremented by at least 1 again each time once the second counter was incremented for the case that the second counter was incremented at least twice without the first counter being incremented in between. Thus, the method is carried out not only for the first time, that an overlap of pulses is assumed, but every time that an overlap of pulses is assumed. This improves the accuracy.

According to at least one embodiment of the method, the input voltage signal is provided by a frontend circuit of a photon counting system. The frontend circuit can be connected with the first comparator and the second comparator. The photon counting system can be employed in multi-energy spectral CT.

According to at least one embodiment of the method, the frontend circuit is configured to convert current pulses generated by a photon detector into voltage pulses forming the input voltage signal. The frontend circuit can be connected with the photon detector. The input voltage signal includes the voltage pulses provided by the frontend circuit. Thus, the method can be employed in multi-energy spectral CT.

According to at least one embodiment of the method, the first counter is incremented by 1 once the input voltage level is higher than the first voltage level and the second counter is incremented by 1 once the input voltage level is higher than the second voltage level. In this way, each voltage pulse with a voltage level higher than the first voltage level is counted by the first counter and each voltage pulse with a voltage level higher than the second voltage level is counted by the second counter. The first counter and the second counter are only incremented by 1 since the detection of the voltage pulse relates to at least one voltage pulse. The voltage pulse can be spectrally analyzed since the first comparator and the second comparator relate to different voltage levels.

According to at least one embodiment of the method, the input voltage signal is received by a pile-up comparator, the pile-up comparator compares the input voltage level to a pile-up voltage level and the absolute value of the pile-up voltage level is higher than the absolute value of the first voltage level and the absolute value of the second voltage level. The pile-up comparator can work in the same way or in a similar way in comparison to the first comparator and the second comparator with the only difference that the pile-up voltage level is higher than the first voltage level and the second voltage level. The pile-up comparator can include a third discriminator. The pile-up voltage level can be higher than an expected input voltage level for one voltage pulse. It is also possible that the pile-up voltage level is higher than twice the expected input voltage level for one voltage pulse.

The pile-up comparator can be employed to detect a situation where at least 2 voltage pulses overlap. Thus, the pile-up voltage level can be chosen high enough, so that the pile-up voltage level is only reached by the input voltage level for the case that at least two voltage pulses overlap. This means, once the input voltage level is detected to be higher than the pile-up voltage level it is assumed that at least two voltage pulses overlap. This information can advantageously be used for analyzing the input voltage signal which can improve the accuracy of the method.

According to at least one embodiment of the method, the first counter and the second counter are both incremented by at least 1 once the input voltage level is higher than the pile-up voltage level. In this case, the first counter and the second counter are incremented independently from the first comparator and the second comparator. Thus, for the case that the input voltage level is higher than the pile-up voltage level, the first counter and the second counter are both incremented by at least 1 irrespective of the state of the first discriminator and the second discriminator. The first counter and the second counter are both incremented by at least 1 once the third discriminator is switched into the active state. For the case that the input voltage level is higher than the pile-up voltage level it is assumed that at least two voltage pulses overlap with each other. Thus, before the input voltage level drops below the first voltage level or below the second voltage level another voltage pulse arrives. As the input voltage level is still higher than the first voltage level and the second voltage level, the first counter and the second counter would usually not be incremented. However, in this case here the first counter and the second counter are incremented since it is assumed that the input voltage signal includes at least two pulses that overlap. With this assumption, the accuracy of determining the count rate is improved. Without incrementing the first counter and the second counter for the case that the input voltage level is higher than the pile-up voltage level, the first counter and the second counter would count too few voltage pulses. The second one of the two overlapping voltage pulses would not be counted.

According to at least one embodiment of the method, the first counter and the second counter are both incremented by more than 1 once the input voltage level is higher than the pile-up voltage level. The first counter and the second counter are both incremented by more than 1 once the third discriminator is switched into the active state. In this case, it is assumed that for the case that the input voltage level is higher than the pile-up voltage level more than two voltage pulses overlap with each other. It can for example be assumed that three voltage pulses overlap with each other. In this case the first counter and the second counter can be both incremented by 2 once the input voltage level is higher than the pile-up voltage level. Thus, the count rate is corrected under the assumption that three voltage pulses overlap. How much the first counter and the second counter are incremented can be chosen depending on an expected amplitude of a voltage pulse of the input voltage signal. The first counter and the second counter can be incremented by the number of the expected amplitude levels that need to be added up to reach the pile-up voltage level. Incrementing the first counter and the second counter by more than one can further increase the accuracy for the case that many voltage pulses overlap.

The method furthermore has the advantage that not for all embodiments a high-speed clock is required.

According to at least one embodiment of the method, the first counter and the second counter are incremented each time at a set point in time during the period of a main clock running with a main clock frequency during the time that the input voltage level is higher than the pile-up voltage level. This means, the first counter and the second counter are incremented each time at a set point in time during one period of the main clock frequency. The set point in time during the period can for example be the start of the period. The main clock can be an asynchronous clock. It is also possible that the main clock is a synchronous clock that starts once the input voltage level is higher than the pile-up voltage level. The first counter and the second counter are incremented for the case that the input voltage level is higher than the pile-up voltage level at the set point in time during the period of the main clock. The first counter and the second counter can be incremented each time at the set point in time during the period of the main clock during the time that the input voltage level is higher than the pile-up voltage level by 1 or by more than 1. The main clock frequency can be chosen in such a way that its period is as long as an expected pulse width of a voltage pulse within the input voltage signal. The pulse width can be the full width at half maximum or an approximated or empirically derived duration that corresponds to the most probably width of the pulse at the pile-up comparator. It is thus assumed that during the time that the input voltage level is higher than the pile-up voltage level, after each period of the main clock at least one voltage pulse is comprised by the input voltage signal. Thus, for each of these voltage pulses the first counter and the second counter are incremented. This means, even for the case that at least two voltage pulses overlap so that the input voltage level is higher than the pile-up voltage level, the first counter and the second counter are incremented for each time that a new voltage pulse is expected to be comprised by the input voltage signal. With this, the accuracy of determining the count rate is improved.

According to at least one embodiment of the method, the first counter and the second counter are incremented each time by at least 1 except for the first time at a set point in time during the period of a main clock running with a main clock frequency during the time that the input voltage level is higher than the pile-up voltage level. The set point in time during the period can for example be the start of the period. The first counter and the second counter are incremented each time at the set point in time during the period of the main clock during the time that the input voltage level is higher than the pile-up voltage level after at least one period of the main clock passed during the time that the input voltage level is higher than the pile-up voltage level.

According to at least one embodiment of the method, the first counter and the second counter are incremented each time by at least 1 except for at least once or more than once at a set point in time during the period of a main clock running with a main clock frequency during the time that the input voltage level is higher than the pile-up voltage level.

According to at least one embodiment of the method, the first counter and the second counter are incremented each time at a set point in time during the period of the main clock during the time that the input voltage level is higher than the pile-up voltage level after two or more periods of the main clock passed during the time that the input voltage level is higher than the pile-up voltage level.

According to at least one embodiment of the method, the period of the main clock is equal to or longer than an expected pulse width of pulses of the input voltage signal. The expected pulse width can be the full width at half maximum of that pulse. For example in CT, pulses detected by a photon detector have an expected pulse width. Employing this expected pulse width as the length of the period of the main clock signal further increases the accuracy of the method. In this way, it can be counted how many voltage pulses are expected during the time that the input voltage level is higher than the pile-up voltage level.

According to at least one embodiment of the method, the first counter is incremented each time at a set point in time during the period of a first clock running with a first clock frequency during the time that the input voltage level is higher than the pile-up voltage level and the second counter is incremented each time at a set point in time during the period of a second clock running with a second clock frequency during the time that the input voltage level is higher than the pile-up voltage level. It is possible that the first counter is incremented by 1 or by more than 1 each time at a set point in time during the period of the first clock during the time that the input voltage level is higher than the pile-up voltage level and that the second counter is incremented by 1 or by more than 1 each time at a set point in time during the period of the second clock during the time that the input voltage level is higher than the pile-up voltage level. The point in time can in each case be the start of the respective period. The first clock can be an asynchronous clock. It is also possible that the first clock is a synchronous clock that starts once the input voltage level is higher than the pile-up voltage level. The second clock can be an asynchronous clock. It is also possible that the second clock is a synchronous clock that starts once the input voltage level is higher than the pile-up voltage level.

The first clock frequency can be chosen in such a way that its period is as long as an expected pulse width of a voltage pulse with an amplitude that is equal to the first voltage level. It is thus assumed that during the time that the input voltage level is higher than the pile-up voltage level after each period of the first clock at least one voltage pulse with an amplitude that is at least as high as the first voltage level is comprised by the input voltage signal. Thus, for each of these pulses the first counter is incremented. The second clock frequency can be chosen in such a way that its period is as long as an expected pulse width of a voltage pulse with an amplitude that is equal to the second voltage level. It is thus assumed that during the time that the input voltage level is higher than the pile-up voltage level after each period of the second clock at least one voltage pulse with an amplitude that is at least as high as the second voltage level is comprised by the input voltage signal. Thus, for each of these pulses the second counter is incremented. This means, even for the case that at least two voltage pulses overlap so that the input voltage level is higher than the pile-up voltage level, the first counter and the second counter are incremented for each time that a new voltage pulse is expected to be comprised by the input voltage signal. With this, the accuracy of determining the count rate is improved.

According to at least one embodiment of the method, the first counter is incremented only under the given conditions. In situations that do not relate to the given conditions, the first counter is not incremented. The given conditions are the conditions for which it is described that the first counter is incremented.

According to at least one embodiment of the method, the second counter is incremented only under the given conditions. In situations that do not relate to the given conditions, the second counter is not incremented. The given conditions are the conditions for which it is described that the second counter is incremented.

Furthermore, another method for operating a circuit arrangement is provided. All features disclosed for the method for operating a circuit arrangement are also disclosed for the other method for operating a circuit arrangement and vice-versa.

According to at least one embodiment of the method, the method includes receiving an input voltage signal with an input voltage level by at least one first comparator, by at least one second comparator and by at least one pile-up comparator, comparing the input voltage level to a first voltage level by the first comparator, comparing the input voltage level to a second voltage level by the second comparator, comparing the input voltage level to a pile-up voltage level by the pile-up comparator, incrementing a first counter assigned to the first comparator once the input voltage level is higher than the first voltage level, incrementing a second counter assigned to the second comparator once the input voltage level is higher than the second voltage level, and incrementing the first counter and the second counter by at least 1 once the input voltage level is higher than the pile-up voltage level, wherein the absolute value of the first voltage level is lower than the absolute value of the second voltage level, and the absolute value of the pile-up voltage level is higher than the absolute value of the first voltage level and the absolute value of the second voltage level.

With this method the same advantages as with the method described further above can be achieved. For the case that the input voltage level is higher than the pile-up voltage level, the first counter and the second counter are both incremented by at least 1 irrespective of the state of the first discriminator and the second discriminator. For the case that the input voltage level is higher than the pile-up voltage level it is assumed that at least two voltage pulses overlap with each other. Thus, before the input voltage level drops below the first voltage level or below the second voltage level another voltage pulse arrives. As the input voltage level is still higher than the first voltage level and the second voltage level, the first counter and the second counter would usually not be incremented. However, in this case here the first counter and the second counter are incremented since it is assumed that the input voltage signal includes at least two pulses that overlap. With this assumption, the accuracy of determining the count rate is improved.

According to at least one embodiment of the method, the first counter is incremented again after the input voltage level being lower and higher again than the first voltage level, and the second counter is incremented again after the input voltage level being lower and higher again than the second voltage level.

Furthermore, a circuit arrangement is provided. The circuit arrangement can preferably be employed for the method for operating a circuit arrangement described herein. This means all features disclosed for the method for operating a circuit arrangement are also disclosed for the circuit arrangement and vice-versa.

According to at least one embodiment of the circuit arrangement, the circuit arrangement includes an input for receiving an input voltage signal with an input voltage level. The input can be connectable to a frontend circuit of a photon counting system. Thus, the circuit arrangement can be a circuit arrangement for photon counting. The circuit arrangement can include the frontend circuit. In this case, the input is connected with the frontend circuit. The frontend circuit can be configured to convert current pulses into voltage pulses. The voltage pulses or at least some of the voltage pulses can form the input voltage signal. The frontend circuit can be configured to receive current pulses from a photon detector, as for example employed in CT.

The circuit arrangement further includes a first comparator that is connected with the input and that is configured to compare the input voltage level to a first voltage level. The first comparator can include a first input at which it is configured to receive the input voltage signal. The first comparator can further include a second input at which it is configured to receive a first voltage signal with the first voltage level. The first comparator can further include an output. The first comparator can be configured to provide a first output signal at its output for the case that the input voltage level is higher than the first voltage level or than the absolute value of the first voltage level. The first output signal can include a trigger signal.

The circuit arrangement further includes a second comparator that is connected with the input and that is configured to compare the input voltage level to a second voltage level. The second comparator can include a first input at which it is configured to receive the input voltage signal. The second comparator can further include a second input at which it is configured to receive a second voltage signal with the second voltage level. The second comparator can further include an output. The second comparator can be configured to provide a second output signal at its output for the case that the input voltage level is higher than the second voltage level or than the absolute value of the second voltage level. The second output signal can include a trigger signal.

The circuit arrangement further includes a first counter that is assigned to the first comparator and that is configured to be incremented once the input voltage level is higher than the first voltage level. The circuit arrangement further includes a second counter that is assigned to the second comparator and that is configured to be incremented once the input voltage level is higher than the second voltage level.

The first counter is configured to be incremented again after the input voltage level being lower and higher again than the first voltage level, the second counter is configured to be incremented again after the input voltage level being lower and higher again than the second voltage level, the first counter is configured to be incremented again once the second counter was incremented twice without the first counter being incremented in between, and the absolute value of the first voltage level is lower than the absolute value of the second voltage level.

The circuit arrangement can further include a first overlap detection component which is connected with the first comparator, the first counter and the second comparator. The first overlap detection component can include a first input that is connected with the output of the first comparator. The first overlap detection component can include a second input that is connected with the output of the second comparator. The first overlap detection component can include an output that is connected with the first counter. The first overlap detection component can be configured to provide a trigger signal to the first counter. Once the first counter receives a trigger signal, it is incremented. The first overlap detection component can be configured to provide a trigger signal once it receives a first output signal from the first comparator. In addition, the first overlap detection component can be configured to provide a trigger signal again after the input voltage level being lower and higher again than the first voltage level. In addition, the first overlap detection component can be configured to provide a trigger signal again once the second counter was incremented twice without the first counter being incremented in between.

The circuit arrangement is configured to detect voltage pulses in the input voltage signal. This can be achieved by counting the number of voltage pulses per time of the input voltage signal for different energy ranges, this means for different voltage ranges. This counting can be carried out by employing the comparators and the counters. With the circuit arrangement, errors in counting voltage pulses are avoided or reduced in the same way as described with the method for operating a circuit arrangement. Thus, the circuit arrangement can be operated with an improved accuracy. Furthermore, the circuit arrangement enables that voltage pulses are counted with a non-paralyzable count rate response.

According to at least one embodiment of the circuit arrangement, the first counter is connected with the second comparator. The first counter can be connected with the second comparator via the first overlap detection component. Thus, the first counter can also be incremented for the case that at least two voltage pulses pile up on top of each other.

According to at least one embodiment of the circuit arrangement, the circuit arrangement includes a pile-up comparator that is connected with the input and that is configured to compare the input voltage level to a pile-up voltage level, the absolute value of the pile-up voltage level is higher than the absolute value of the first voltage level and the absolute value of the second voltage level, and the first counter and the second counter are connected with the pile-up comparator. The pile-up comparator can include a first input at which it is configured to receive the input voltage signal. The pile-up comparator can further include a second input at which it is configured to receive a third voltage signal with the pile-up voltage level. The pile-up comparator can further include an output. The pile-up comparator can be configured to provide a third output signal at its output for the case that the input voltage level is higher than the pile-up voltage level or than the absolute value of the pile-up voltage level.

The first counter can be connected with the pile-up comparator via a first gate component. The first gate component can include a first input that is connected with the output of the first overlap detection component. The first gate component can further include a second input that is connected with the output of the pile-up comparator. The first gate component can further include an output that is connected with the first counter. The first gate component can be configured to provide a trigger signal to the first counter. Once the first counter receives a trigger signal it is incremented. The first gate component can be configured to provide a trigger signal once it receives a third output signal from the pile-up comparator. In addition, the first gate component can be configured to provide a trigger signal once it receives a trigger signal from the first overlap detection component. The first gate component can be or include an OR-gate.

The second counter can be connected with the pile-up comparator via a second gate component. The second gate component can include a first input that is connected with the output of the second comparator. The second gate component can further include a second input that is connected with the output of the pile-up comparator. The second gate component can further include an output that is connected with the second counter. The second gate component can be configured to provide a trigger signal to the second counter. Once the second counter receives a trigger signal, it is incremented. The second gate component can be configured to provide a trigger signal once it receives a third output signal from the pile-up comparator. In addition, the second gate component can be configured to provide a trigger signal once it receives a second output signal from the second comparator. The second gate component can be or include an OR-gate.

Employing the pile-up comparator enables to increment the first counter and the second counter for the case that the input voltage level is higher than the pile-up voltage level. It is assumed that in this case the input voltage signal includes at least two pulses that overlap. With this, the accuracy of determining the count rate is improved as the first counter and the second counter are incremented for both pulses.

According to at least one embodiment of the circuit arrangement, a main clock running with a main clock frequency and the pile-up comparator are connected with a trigger generator that is configured to generate a trigger signal at a set point in time during the period of the main clock during the time that the input voltage level is higher than the pile-up voltage level. The trigger generator can be connected with the pile-up comparator and the main clock. The trigger generator can further be connected with the first counter and the second counter. The trigger generator can include a first input that is connected with the output of the pile-up comparator. The trigger generator can include a second input that is connected with the main clock. The trigger generator can include an output that is connected with the second input of the first gate component and with the second input of the second gate component. The trigger generator can be configured to generate a trigger signal at that point in time during the period of the main clock at which a main clock signal starts to rise. With the main clock, even for the case that at least two voltage pulses overlap so that the input voltage level is higher than the pile-up voltage level, the first counter and the second counter are incremented for each time that a new voltage pulse is expected to be comprised by the input voltage signal. With this, the accuracy of determining the count rate is improved.

BRIEF DESCRIPTION OF THE DRAWINGS

The following description of figures may further illustrate and explain exemplary embodiments. Components that are functionally identical or have an identical effect are denoted by identical references. Identical or effectively identical components might be described only with respect to the figures where they occur first. Their description is not necessarily repeated in successive figures.

FIGS. 12, 13 and 14 show exemplary embodiments of a circuit arrangement.

DETAILED DESCRIPTION

Figure 1:
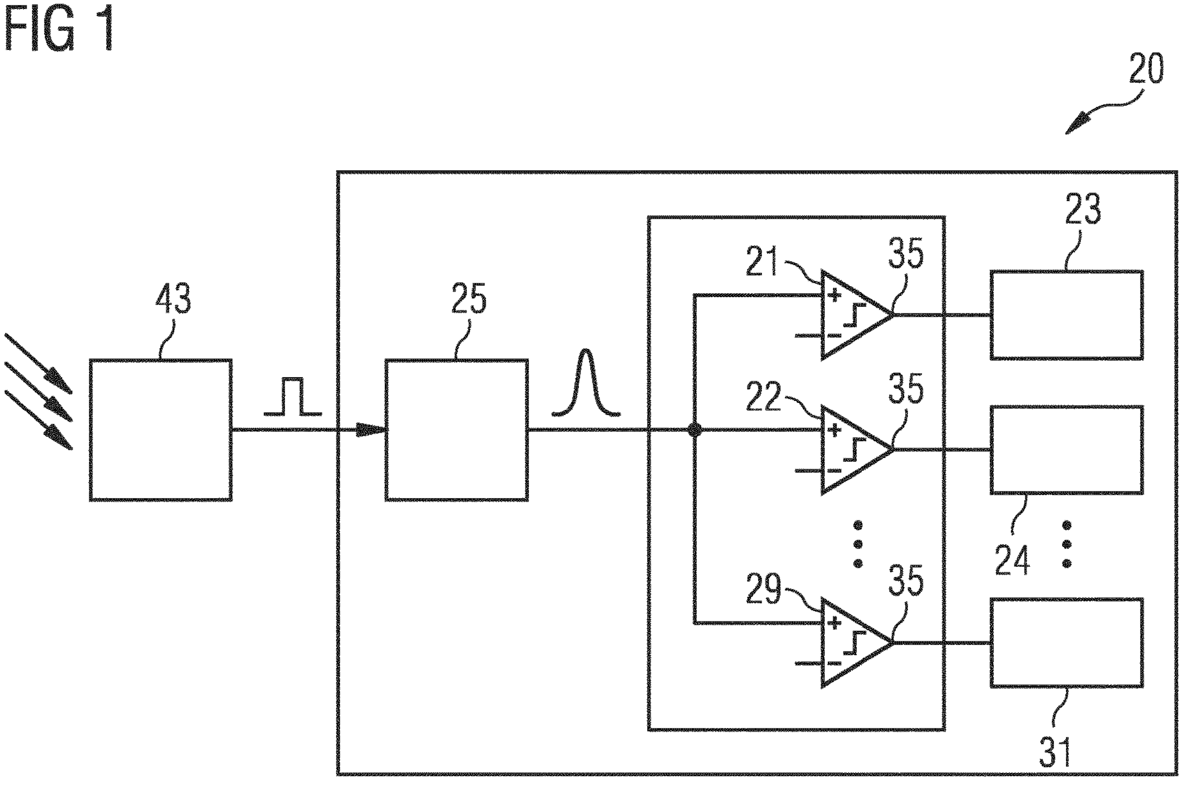
FIG. 1 shows the general setup of a photon counting system.

FIG. 1 shows the setup of a photon counting system which is no embodiment. A photon detector 43 can be exposed to photons and it is configured to detect photons. The photon detector 43 includes a direct conversion sensor that generates electron-hole clouds in response to the interaction of an X-ray photon within the bulk. The direct conversion sensor can include CdTe, CdZnTe, GaAs or Si. The amount of charge is proportional to the energy of the impinging photon. Electrons induce a transient current signal on their collecting electrode (anode) which is then further processed. The photon detector 43 is thus configured to provide one or more current pulses to a frontend circuit 25 in response to the detection of photons. One current pulse is schematically depicted between the photon detector 43 and the frontend circuit 25. The frontend circuit 25 is configured to convert the one or more current pulses into one or more voltage pulses. The one or more voltage pulses are provided to a circuit arrangement 20 which is no embodiment. The circuit arrangement 20 includes a network of comparators 21, 22, 29 that constitute an analog-to-digital converter (ADC). One voltage pulse is schematically depicted between the frontend circuit 25 and the comparators 21, 22, 29. The ADC includes a plurality of comparators 21, 22, 29. Each comparator 21, 22, 29 is configured to convert analog signals into digital signals. It depends on the peak voltage of a voltage pulse provided by the frontend circuit 25 which of the comparators 21, 22, 29 will trigger. This means, each of the comparators 21, 22, 29 is assigned to a different voltage level. In this way, the voltage pulses can be counted in dependence of their peak voltage. For this purpose, an output 35 of each comparator 21, 22, 29 is connected to a counter 23, 24, 31. Thus, spectral information can be obtained with the circuit arrangement 20.

Figure 2:
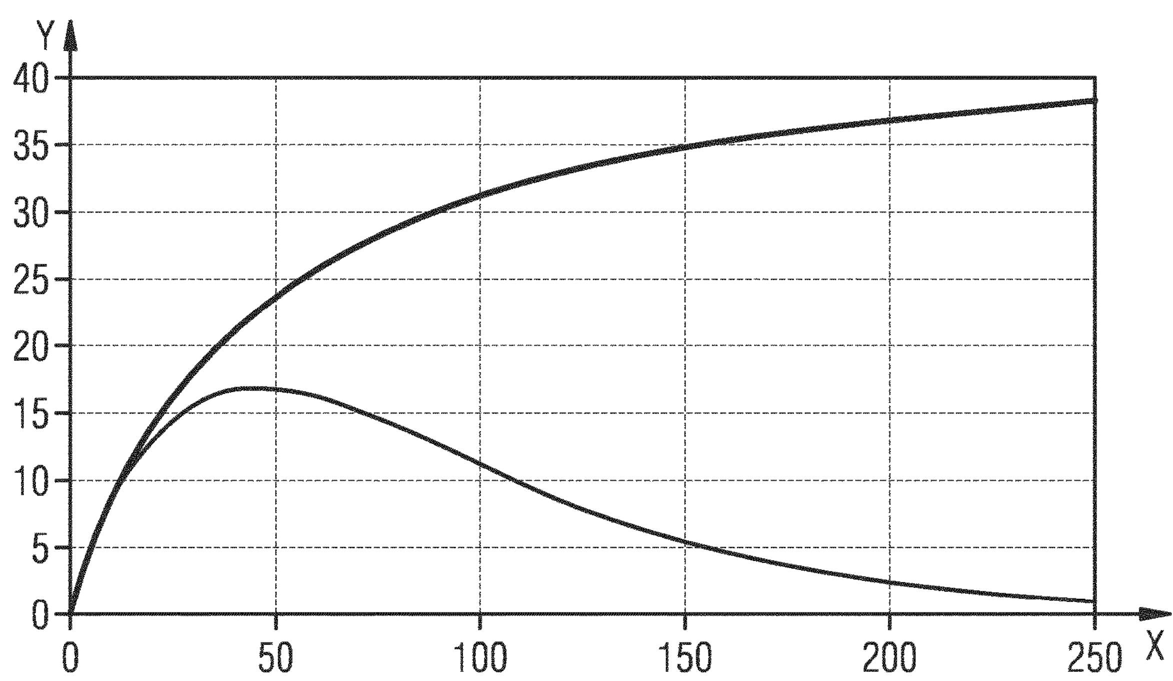
FIG. 2 shows the paralyzable model and the non-paralyzable model.

With FIG. 2 the paralyzable model and the non-paralyzable model are described. On the x-axis the impinging count rate is plotted in million counts per second per pixel and on the y-axis the observed count rate is plotted in million counts per second per pixel. According to the paralyzable model the observed count rate first increases and then decreases again with increasing impinging count rate (black curve in FIG. 2). According to the non-paralyzable model the observed count rate increases with increasing impinging count rate over the whole range of impinging count rates (bold curve in FIG. 2).

Figure 3:
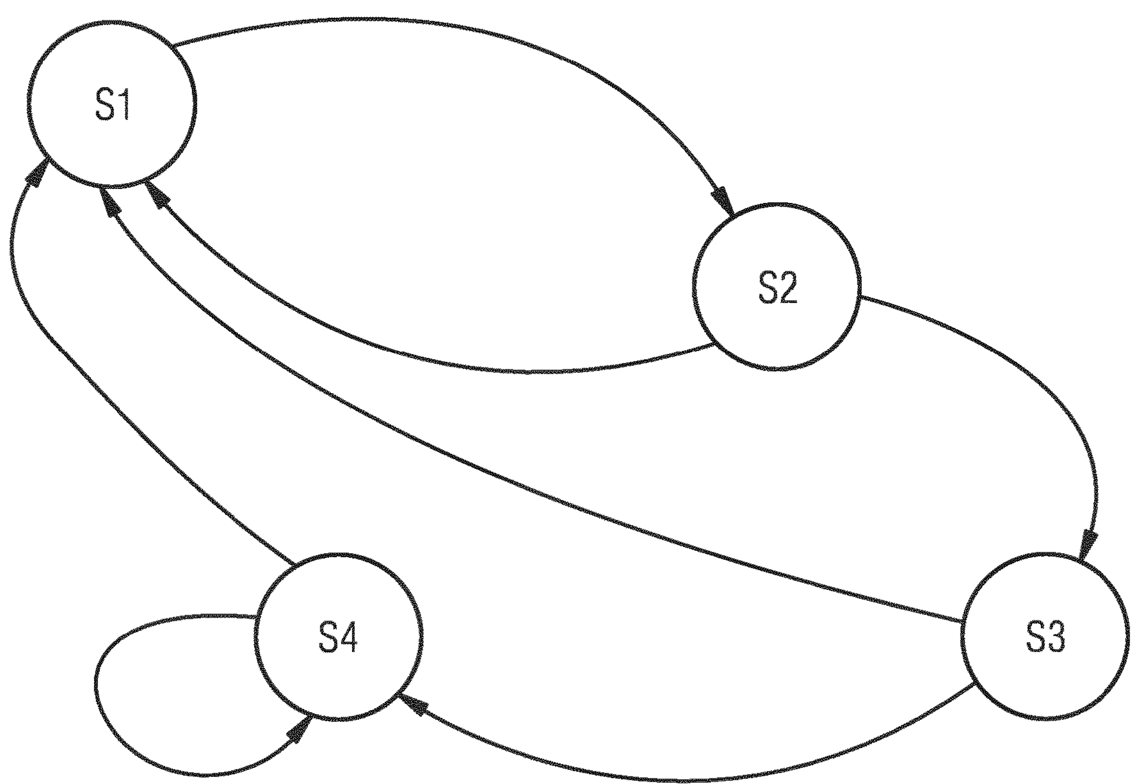
FIGS. 3, 4 and 5 show an exemplary embodiment of the method for operating a circuit arrangement.

With FIG. 3 an exemplary embodiment of the method for operating a circuit arrangement 20 is described. FIG. 3 shows a state machine. A first state S1 is a ground state. If a first comparator 21 that receives an input voltage signal IVS with an input voltage level IVL detects that the input voltage level IVL is higher than a first voltage level FVL by comparing the input voltage level IVL to the first voltage level FVL, a second state S2 is reached and a first counter 23 assigned to the first comparator 21 is incremented. Once the first comparator 21 detects that the input voltage level IVL is below the first voltage level FVL, the ground state S1 is reached again. If a second comparator 22 that receives the input voltage signal IVS detects that the input voltage level IVL is higher than a second voltage level SVL by comparing the input voltage level IVL to the second voltage level SVL, a third state S3 is reached and a second counter 24 assigned to the second comparator 22 is incremented. Once the second comparator 22 detects that the input voltage level IVL is below the second voltage level SVL, the ground state S1 is reached again. Thus, the first counter 23 is incremented again after the input voltage level IVL being lower and higher again than the first voltage level FVL and the second counter 24 is incremented again after the input voltage level IVL being lower and higher again than the second voltage level SVL. If the second counter 24 was incremented twice without the first counter 23 being incremented in between, a third state S3 is reached and the first counter 23 is incremented again. Once the second comparator 22 detects that the input voltage level IVL is below the second voltage level SVL, the ground state S1 is reached again. If the second counter 24 was incremented again without the first counter 23 being incremented, a fourth state S4 is reached and the first counter 23 is incremented again. The fourth state S4 can be reached over and over again. The absolute value of the first voltage level FVL is lower than the absolute value of the second voltage level SVL.

Figure 4:
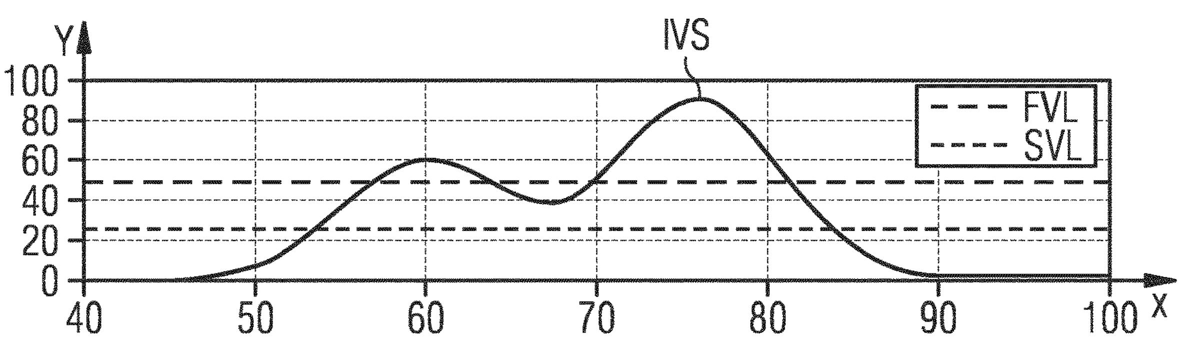
Figure 4:
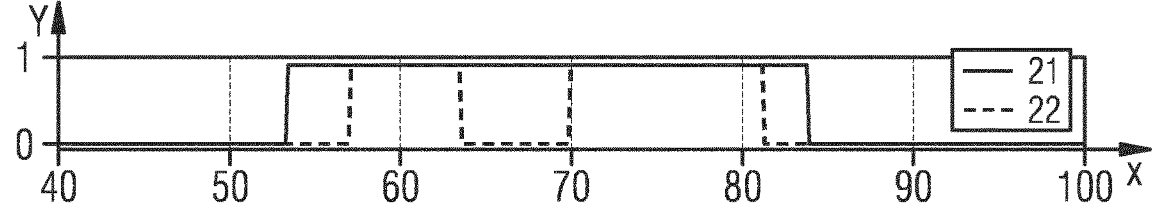
Figure 4:
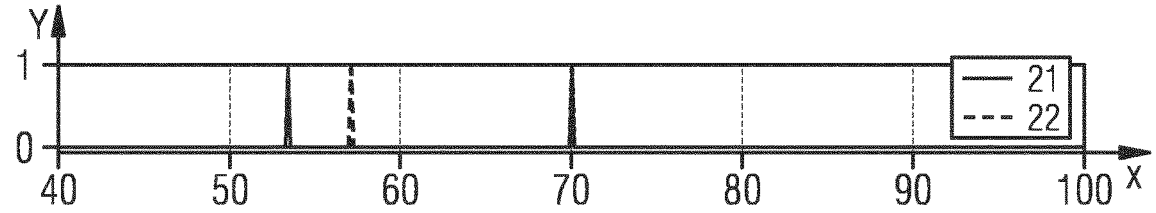
Figure 4:
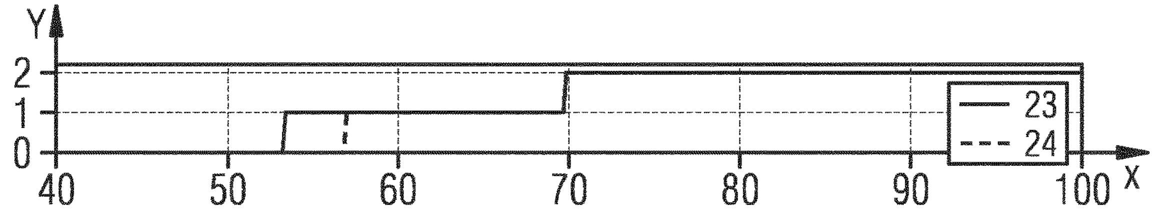

With FIG. 4 the exemplary embodiment of the method for operating a circuit arrangement 20 described with FIG. 3 is described in more detail. In FIG. 4, four diagrams are arranged on top of each other. In the lowest diagram on the x-axis the time is plotted in nanoseconds (ns) and on the y-axis the number of counts of the first counter 23 and the second counter 24 are plotted. In the second lowest diagram on the x-axis the time is plotted in ns and on the y-axis two trigger signals are plotted. One of the trigger signals can be provided by the first comparator 21 and the other trigger signal can be provided by the second comparator 22. In the second highest diagram on the x-axis the time is plotted ns and on the y-axis the state of a first discriminator comprised by the first comparator 21 and the state of a second discriminator comprised by the second comparator 22 are plotted. 0 on the y-axis means that the discriminators are in their inactive state and 1 means that the discriminators are in their active state. In the top diagram on the x-axis the time is plotted in ns and on the y-axis the amplitude of the input voltage signal IVS, thus the input voltage level IVL, is plotted in keV. The first voltage level FVL and the second voltage level SVL are drawn with dashed lines. The x-axis is the same for all four diagrams. The input voltage signal IVS can be provided by a frontend circuit 25 of a photon counting system as for example shown in FIG. 1.

FIG. 4 shows that once the input voltage level IVL is higher than the first voltage level FVL, the first discriminator switches into its active state. Furthermore, the first comparator 21 provides a trigger signal which leads to the first counter 23 being incremented by 1. Once the input voltage level IVL is higher than the second voltage level SVL, the second discriminator switches into its active state. Furthermore, the second comparator 22 provides a trigger signal which leads to the second counter 24 being incremented by 1. Afterwards, the input voltage level IVL drops below the second voltage level SVL. Therefore, the second discriminator switches into its inactive state. As the input voltage level IVL does not drop below the first voltage level FVL, the first discriminator remains in the active state. Afterwards, the input voltage level IVL again rises above the second voltage level SVL. Thus, the second discriminator switches into the active state, the second comparator 22 provides a trigger signal and the second counter 24 is incremented by 1. Since the second counter 24 was incremented twice without the first counter 23 being incremented in between, the first comparator 21 provides a trigger signal and the first counter 23 is incremented as well. From the shape of the input voltage signal IVS, it can be seen that two voltage pulses overlap with each other. Therefore, the input voltage level IVL does not drop below the first voltage level FVL between the two pulses. Even though the first discriminator is still in its active state, the first counter 23 is incremented again as it can be assumed from the second counter 24 being incremented twice that at least two voltage pulses overlap with each other. Thus, by incrementing the first counter 23 again, the number of counts is corrected for this case that at least two voltage pulses overlap. Later, the input voltage level IVL drops below the second voltage level SVL and thus the second discriminator returns into its inactive state. Afterwards, the input voltage level IVL drops below the first voltage level FVL and thus the first discriminator returns to its inactive state. The first voltage level FVL can be 25 keV and the second voltage level SVL can be 50 keV.

Figure 5:
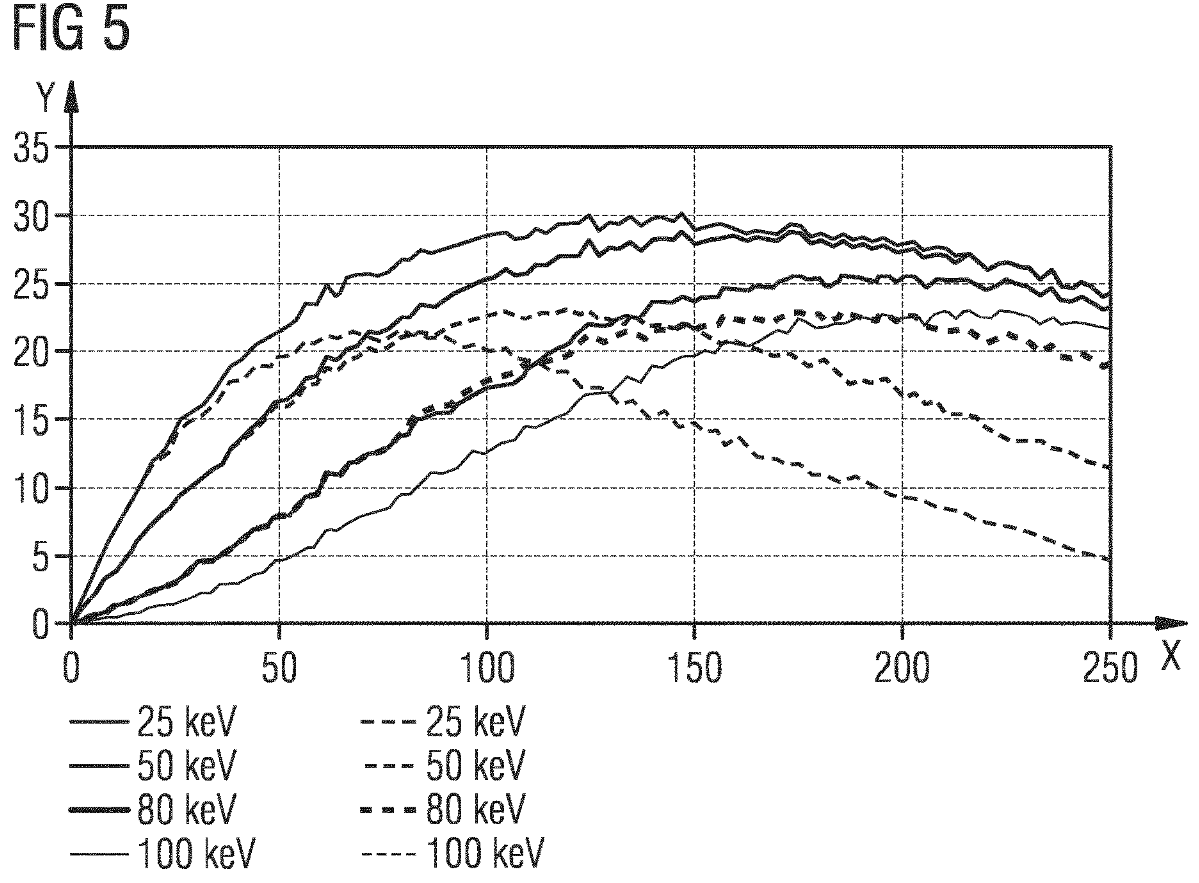

FIG. 5 shows the observed count rate for four different comparators. On the x-axis the incident count rate is plotted in million counts per second per pixel and on the y-axis the observed count rate is plotted in million counts per second per pixel for four different energy levels, this means for four different comparators. The observed count rates are simulated. The dashed lines refer to the case, that a method is employed which is no embodiment. In this method a counter is only incremented again, after the respective discriminator has been in its inactive state. The straight lines refer to the method described with FIGS. 3 and 4. For both methods, the observed count rate is plotted for different discriminators whose energy levels are provided in FIG. 5. It can be seen, that the curves show a monotonic behavior up to higher count rates for the case that it is counted as described with FIGS. 3 and 4 in comparison to the method which is no embodiment.

Figure 6:
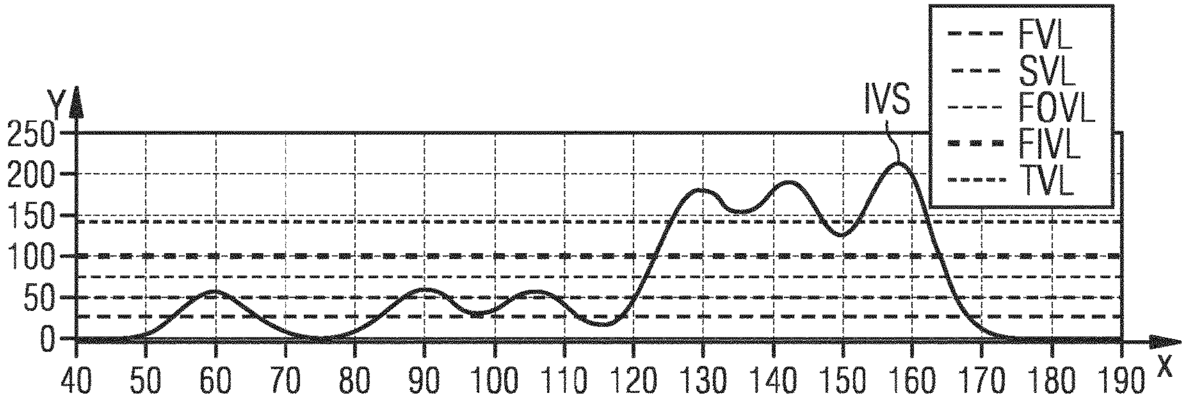
FIGS. 6 and 7 show another exemplary embodiment of the method for operating a circuit arrangement.
Figure 6:
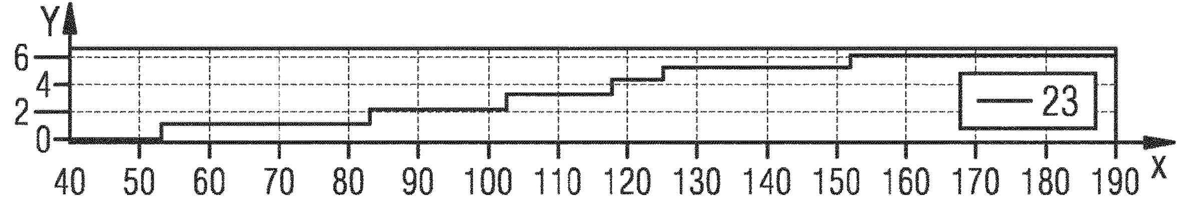
Figure 6:
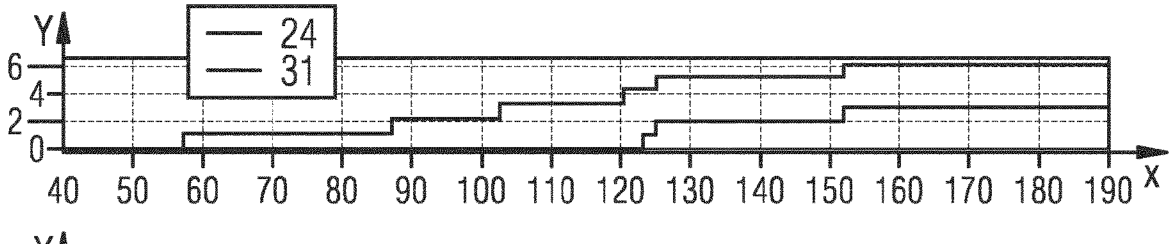
Figure 6:
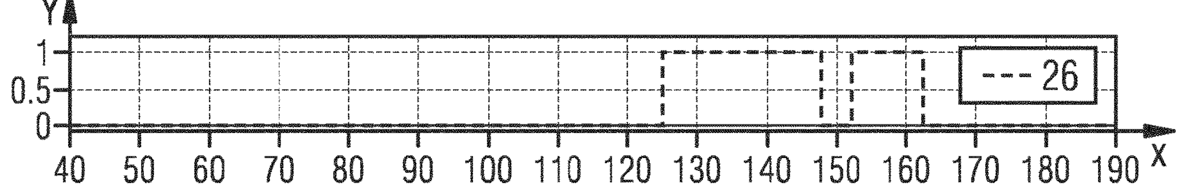

With FIG. 6 another exemplary embodiment of the method for operating a circuit arrangement 20 is described. In FIG. 6, four diagrams are plotted on top of each other. In the lowest diagram on the x-axis the time is plotted in ns and on the y-axis the state of a third discriminator is plotted. 0 on the y-axis relates to the inactive state and 1 relates to the active state. The third discriminator is comprised by a pile-up comparator 26. The pile-up comparator 26 can receive the input voltage signal IVS. The pile-up comparator 26 can compare the input voltage level IVL to a pile-up voltage level TVL. The absolute value of the pile-up voltage level TVL is higher than the absolute value of the first voltage level FVL and the absolute value of the second voltage level SVL. In the second lowest diagram on the x-axis the time is plotted in ns and on the y-axis the number of counts of the second counter 24 and of a third counter 31 are plotted. The third counter 31 is connected with a third comparator 29. The third comparator 29 can receive the input voltage signal IVS. The third comparator 29 can compare the input voltage level IVL to a third voltage level FOVL. The absolute value of the third voltage level FOVL is higher than the absolute value of the first voltage level FVL and the absolute value of the second voltage level SVL. The absolute value of the third voltage level FOVL is lower than the absolute value of the pile-up voltage level TVL. In the second highest diagram on the x-axis the time is plotted in ns and on the y-axis the number of counts of the first counter 23 is plotted. In the top diagram on the x-axis the time is plotted in ns and on the y-axis the amplitude of the input voltage signal IVS, thus the input voltage level IVL, is plotted in keV. The first voltage level FVL, the second voltage level SVL, the pile-up voltage level TVL, the third voltage level FOVL and a fourth voltage level FIVL are drawn with dashed lines. The x-axis is the same for all four diagrams.

Up to 125 ns the method is the same as described with FIG. 4 with the only difference that there is also the third counter 31. Thus, the first counter 23 and the second counter 24 are incremented several times in the first 125 seconds. The third counter 31 is incremented once. At 125 ns the input voltage level IVL increases above the pile-up voltage level TVL. At this point in time the first counter 23, the second counter 24 and the third counter 31 are incremented by one. The pile-up voltage level TVL is chosen to be so high that it is expected that at least two voltage pulses overlap to reach the pile-up voltage level TVL. In order to improve the accuracy of the counting, it is assumed that at least one more voltage pulse is detected which is why the first counter 23, the second counter 24 and the third counter 31 are incremented again at 125 ns. At this point in time also the third discriminator switches into its active state. Shortly before 150 ns the input voltage level IVL drops below the pile-up voltage level but not below the other voltage levels. Thus, the third discriminator returns into its inactive state. Shortly after 150 ns the input voltage level IVL again increases above the pile-up voltage level TVL. Thus, the third discriminator switches into its active state and the first counter 23, the second counter 24 and the third counter 31 are incremented again by 1. After 160 ns the input voltage level IVL drops below the pile-up voltage level. Thus, the third discriminator returns into its inactive state. Afterwards, the input voltage level IVL drops below all the other voltage levels. Therefore, the first counter 23, the second counter 24 and the third counter 31 are not further incremented.

It is also possible that the first counter 23 and the second counter 24 are incremented by more than 1 each time.

Figure 7:
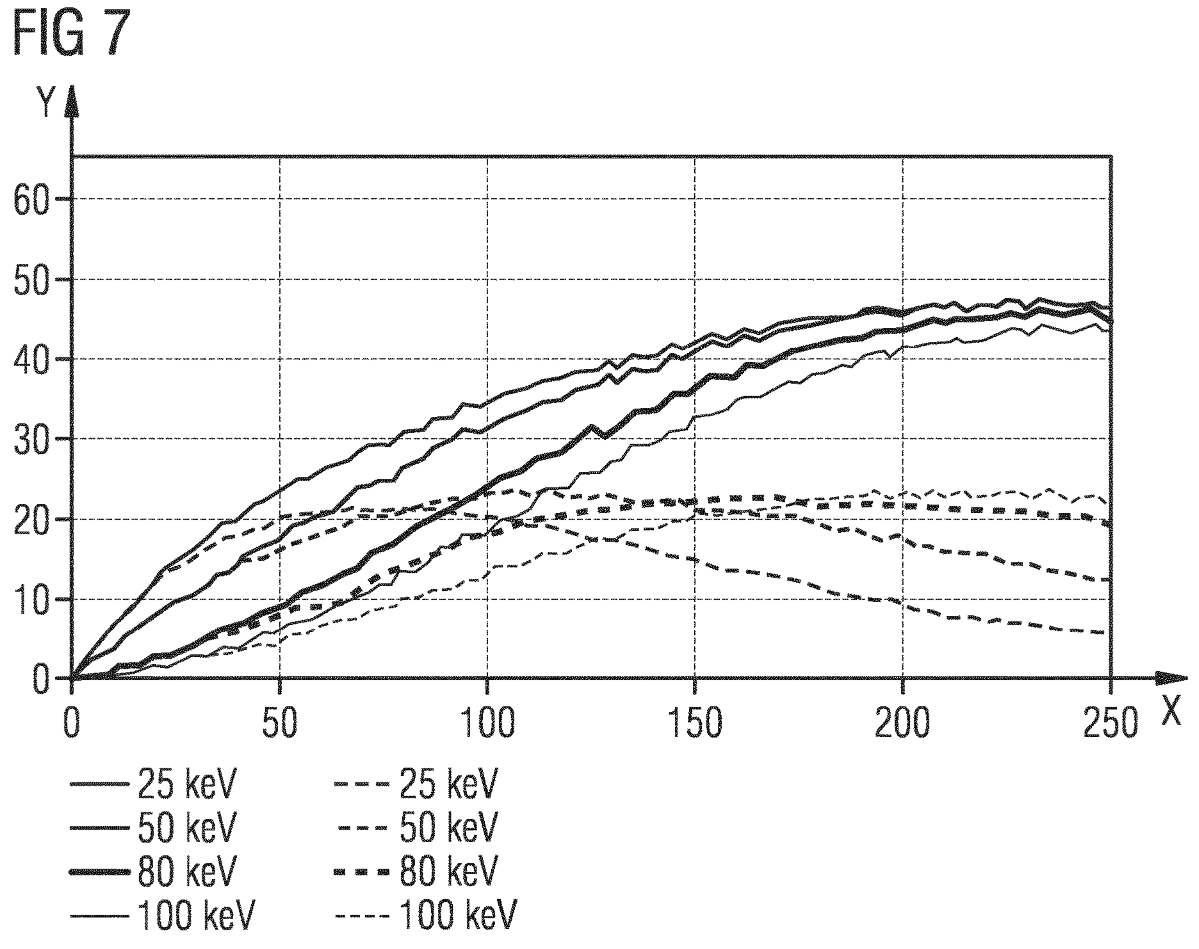

FIG. 7 shows the observed count rate for four different comparators. On the x-axis the incident count rate is plotted in million counts per second per pixel and on the y-axis the observed count rate is plotted in million counts per second per pixel for four different energy levels, this means for four different comparators. The observed count rates are simulated. The dashed lines are the same as in FIG. 5. The straight lines refer to the method described with FIG. 6. For both methods, the observed count rate is plotted for different discriminators whose energy levels are provided in FIG. 7.

It can be seen, that the curves show a non-paralyzable behavior up to higher count rates for the case that it is counted as described with FIG. 6 in comparison to the method which is no embodiment. In comparison to the straight lines shown in FIG. 5, here a non-paralyzable behavior is present up to higher count rates.

In the embodiment of the method described with FIG. 6, the pile-up voltage level TVL is chosen to be 140 keV. In spectral CT usually an x-ray tube cannot generate any X-ray photon with energy higher than the equivalent acceleration voltage of the electron beam. A typical x-ray tube operates at 120 kVp which leads to a maximum photon energy of 120 keV. Furthermore, the X-ray emission distribution is Braking radiation (Bremsstrahlung). That is, the mean energy from a 120 kVp spectrum is around 60-70 keV, depending on filtration. That is, a pile-up event exceeding 120 keV is almost certain to have originated from more than two voltage pulses piled-up on each other. Thus, the pile-up voltage level TVL could also be 120 keV or higher than 140 keV. The pile-up voltage level TVL can be chosen in such a way that the number of voltage pulses that are required to pile up to reach this voltage level can be estimated.

Figure 8:
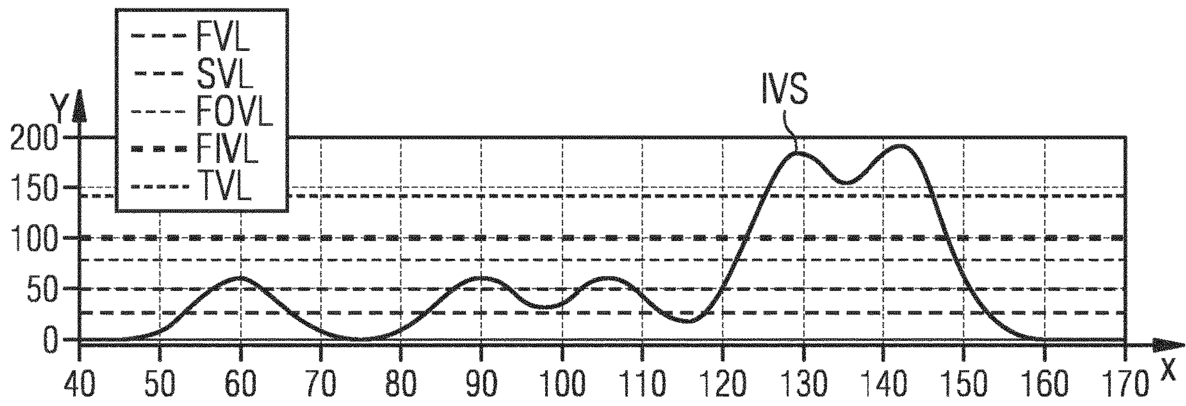
FIGS. 8 and 9 show another exemplary embodiment of the method for operating a circuit arrangement.
Figure 8:
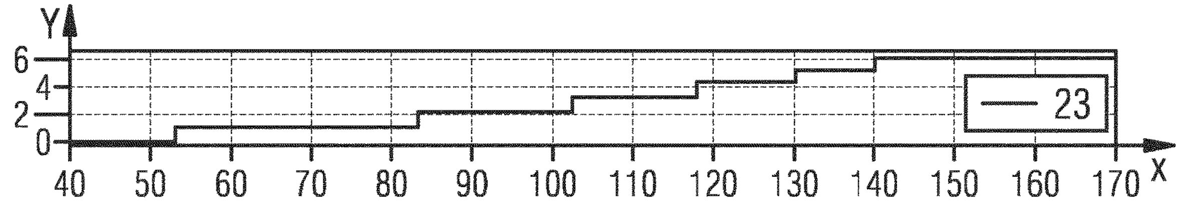
Figure 8:
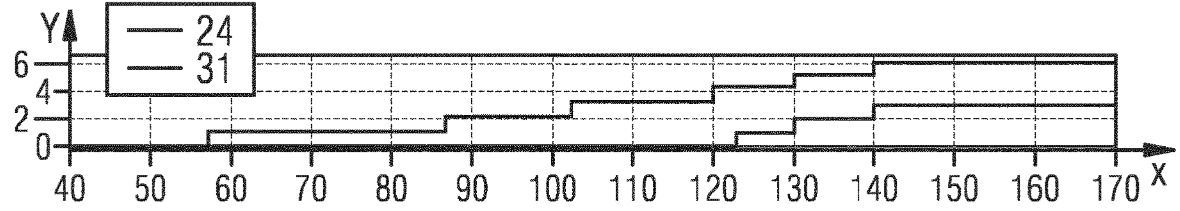
Figure 8:
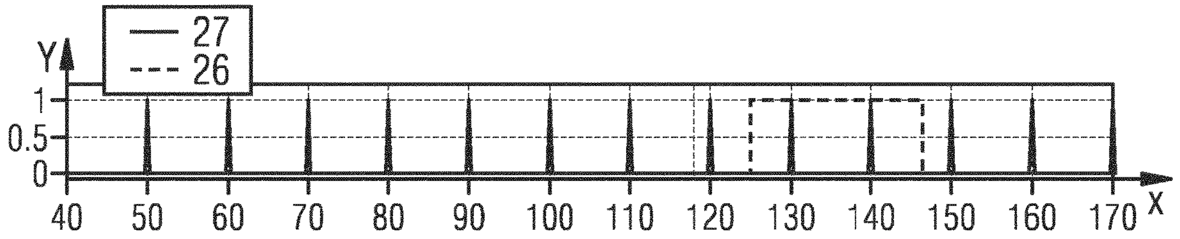

With FIG. 8 another exemplary embodiment of the method for operating a circuit arrangement 20 is described. In FIG. 8, four diagrams are plotted on top of each other. The four diagrams are the same as shown in FIG. 6 with the only difference that in the lowest diagram in addition a main clock signal is plotted. The main clock signal rises once per one period of a main clock 27 which runs with a main clock frequency.

Up to 125 ns the first counter 23, the second counter 24 and the third counter 31 are incremented as described with FIG. 6. At 125 ns the input voltage level IVL rises above the pile-up voltage level TVL. Thus, the third discriminator switches into its active state. In comparison to FIG. 6, here the first counter 23, the second counter 24 and the third counter 31 are not incremented immediately. Instead, the first counter 23, the second counter 24 and the third counter 31 are incremented each time at a set point in time during the period of the main clock 27 during the time that the input voltage level IVL is higher than the pile-up voltage level TVL. In FIG. 8 a set point in time during the period of the main clock 27 is the point in time when the main clock signal rises. During the time that the input voltage level IVL is higher than the pile-up voltage level TVL, the main clock signal rises twice. At each of these times the first counter 23, the second counter 24 and the third counter 31 are incremented by 1. The period of the main clock 27 can be equal to or longer than an expected pulse width of pulses of the input voltage signal IVS.

Figure 9:
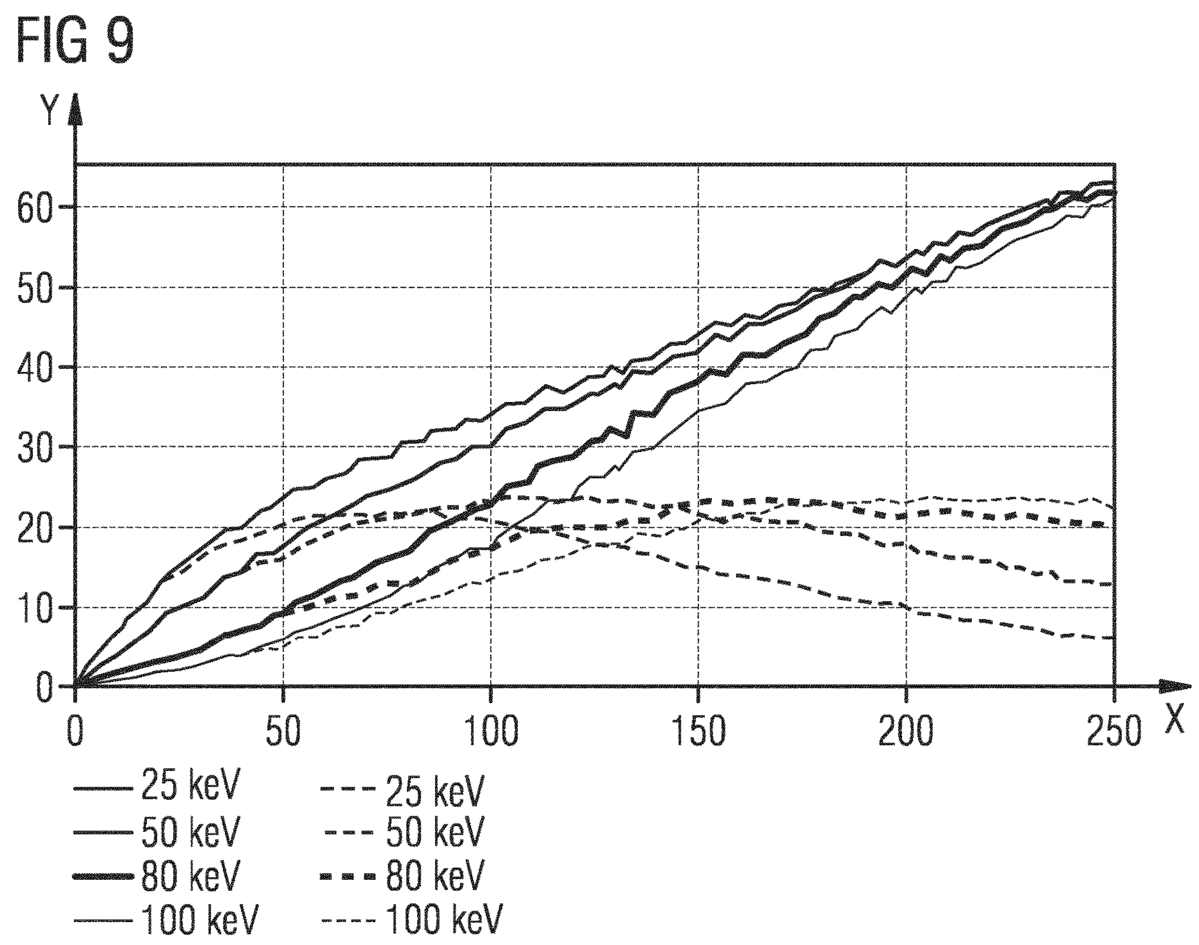

FIG. 9 shows the observed count rate for four different comparators. On the x-axis the incident count rate is plotted in million counts per second per pixel and on the y-axis the observed count rate is plotted in million counts per second per pixel for four different energy levels, this means for four different comparators. The observed count rates are simulated. The dashed lines are the same as in FIG. 5. The straight lines refer to the method described with FIG. 8. For both methods, the observed count rate is plotted for different discriminators whose energy levels are provided in FIG. 9. It can be seen, that the curves show a non-paralyzable behavior up to higher count rates for the case that it is counted as described with FIG. 8 in comparison to the method which is no embodiment and also in comparison to the embodiment described with FIG. 6. In comparison to the straight lines shown in FIG. 5, here a non-paralyzable behavior is present up to higher count rates. In comparison to the straight lines shown in FIG. 6, the count rate response shows a steeper slope.

Figure 10:
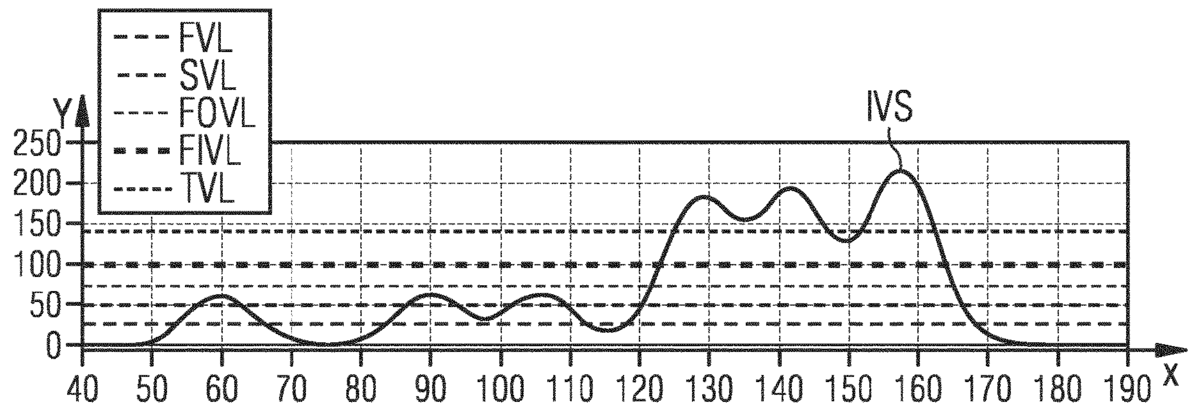
FIGS. 10 and 11 show another exemplary embodiment of the method for operating a circuit arrangement.
Figure 10:
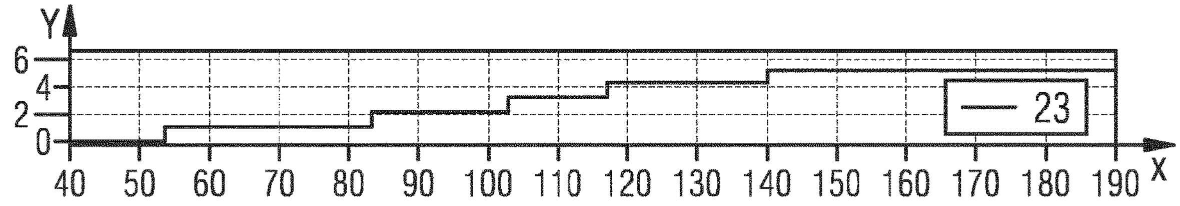
Figure 10:
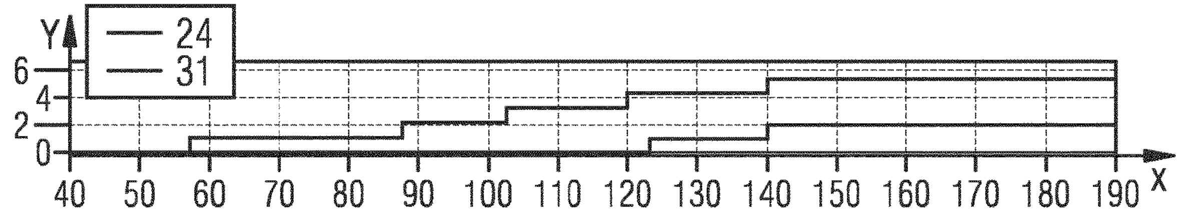
Figure 10:
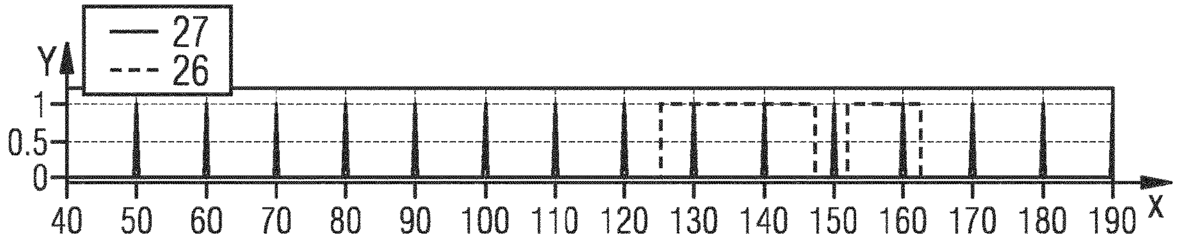

With FIG. 10 another exemplary embodiment of the method for operating a circuit arrangement 20 is described. In FIG. 10, four diagrams are plotted on top of each other. The four diagrams are the same as shown in FIG. 8. Up to 125 ns the first counter 23, the second counter 24 and the third counter 31 are incremented as described with FIG. 6. At 125 ns the input voltage level IVL rises above the pile-up voltage level TVL. Thus, the third discriminator switches into the active state. In comparison to FIG. 8, here the first counter 23, the second counter 24 and the third counter 31 are not incremented immediately. Instead, the first counter 23, the second counter 24 and the third counter 31 are incremented each time by at least 1 except for the first time at a set point in time during the period of the main clock 27 during the time that the input voltage level IVL is higher than the pile-up voltage level TVL. During the first time that the input voltage level IVL is higher than the pile-up voltage level TVL, the main clock signal rises twice. Thus, the first counter 23, the second counter 24 and the third counter 31 are incremented with the second rise of the main clock signal but not with the first rise of the main clock signal. During the second time that the input voltage level IVL is higher than the pile-up voltage level TVL, the main clock signal rises once only. Thus, the first counter 23, the second counter 24 and the third counter 31 are not incremented during the second time that the input voltage level IVL is higher than the pile-up voltage level TVL.

Figure 11:
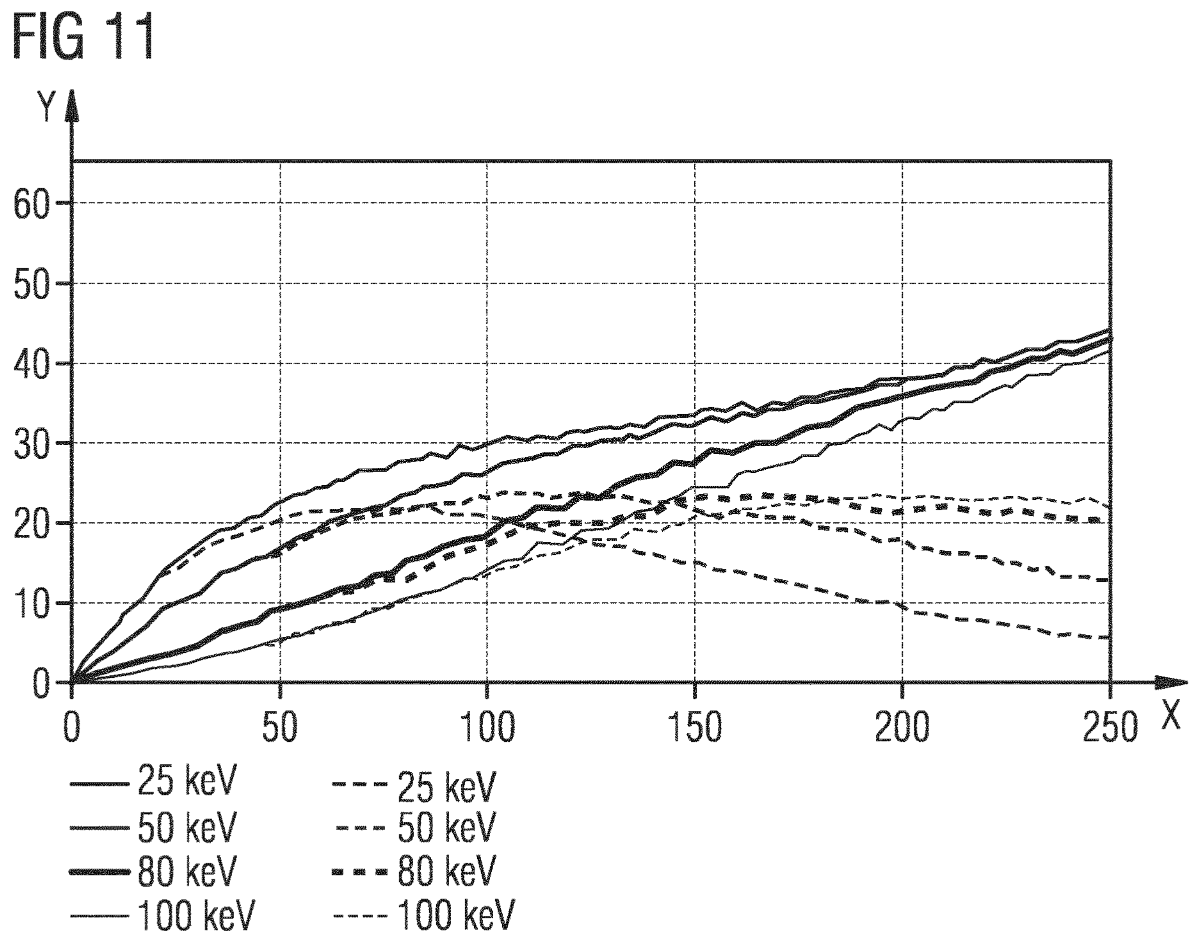

FIG. 11 shows the observed count rate for four different comparators. On the x-axis the incident count rate is plotted in million counts per second per pixel and on the y-axis the observed count rate is plotted in million counts per second per pixel for four different energy levels, this means for four different comparators. The observed count rates are simulated. The dashed lines are the same as in FIG. 5. The straight lines refer to the method described with FIG. 10. For both methods, the observed count rate is plotted for different discriminators whose energy levels are provided in FIG. 11. It can be seen, that the curves show a non-paralyzable behavior up to higher count rates for the case that it is counted as described with FIG. 10 in comparison to the method which is no embodiment and also in comparison to the embodiment described with FIG. 6. In comparison to the straight lines shown in FIG. 5, here a non-paralyzable behavior is present up to higher count rates.

FIGS. 7, 9 and 11 show that the method described herein results in a paralyzable model, but it allows to move the ambiguous response, thus the range within which the paralyzable behavior starts, beyond the range of X-ray fluxes required in CT. This has the advantage that a paralyzable frontend can be employed.

Figure 12:
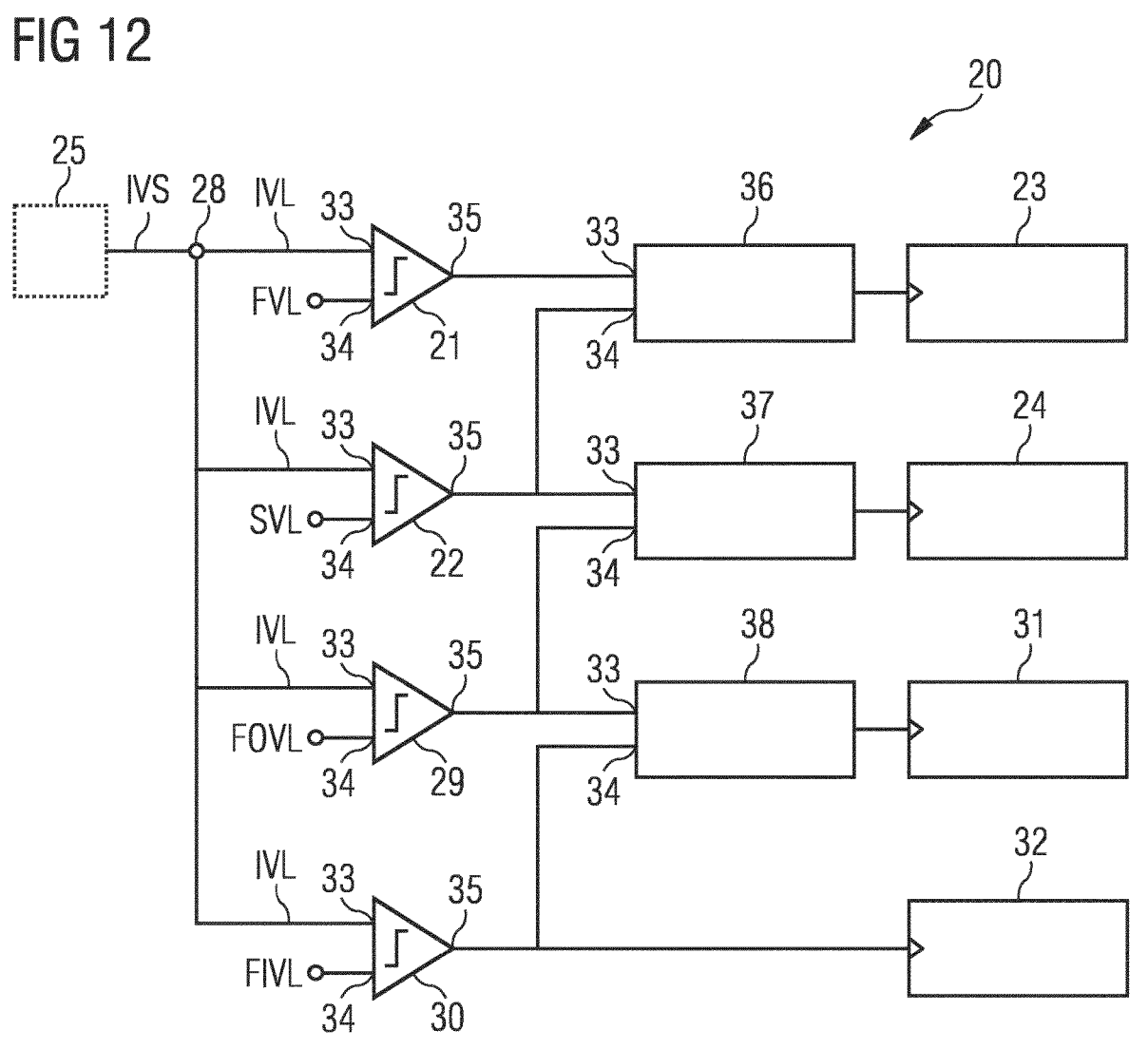

FIG. 12 shows an exemplary embodiment of a circuit arrangement 20. The circuit arrangement 20 includes an input 28 for receiving the input voltage signal IVS. The input 28 is connected with a frontend circuit 25. The frontend circuit 25 is an external component. The frontend circuit 25 can be configured to convert current pulses generated by a photon detector into voltage pulses forming the input voltage signal IVS. The circuit arrangement 20 further includes the first comparator 21 that is connected with the input 28 and that is configured to compare the input voltage level IVL to a first voltage level FVL and the second comparator 22 that is connected with the input 28 and that is configured to compare the input voltage level IVL to a second voltage level SVL. The circuit arrangement 20 further includes a third comparator 29 that is connected with the input 28 that is configured to compare the input voltage level IVL to a third voltage level FOVL and a fourth comparator 30 that is connected with the input 28 and that is configured to compare the input voltage level IVL to a fourth voltage level FIVL. Each comparator 21, 22 29, 30 has a first input 33 that is connected with the input 28. Each comparator 21, 22 29, 30 has a second input 34 where the respective voltage level can be received. Each comparator 21, 22 29, 30 has an output 35 at which a trigger signal can be provided. The voltage levels are all different and the fourth voltage level FIVL is the highest voltage level.

The circuit arrangement 20 further includes a first overlap detection component 36 that is connected with the first comparator 21 and the second comparator 22. The circuit arrangement 20 further includes a second overlap detection component 37 that is connected with the second comparator 22 and the third comparator 29. The circuit arrangement 20 further includes a third overlap detection component 38 that is connected with the third comparator 29 and the fourth comparator 30. Each of the overlap detection components 36, 37, 38 has a first input 33 that is connected with the respective comparator 21, 22, 29. Each of the overlap detection components 36, 37, 38 has a second input 34 that is connected with the neighboring comparator 22, 29, 30.

The circuit arrangement 20 further includes a first counter 23 that is connected with the first comparator 21 via the first overlap detection component 36. Thus, the first counter 23 is connected with the second comparator 22. The circuit arrangement 20 further includes a second counter 24 that is connected with the second comparator 22 via the second overlap detection component 37. Thus, the second counter 24 is connected with the third comparator 29. The circuit arrangement 20 further includes a third counter 31 that is connected with the third comparator 29 via the third overlap detection component 38. Thus, the third counter 31 is connected with the fourth comparator 30. The circuit arrangement 20 further includes a fourth counter 32 that is connected with the fourth comparator 30.

The first counter 23 is assigned to the first comparator 21 and is configured to be incremented once the input voltage level IVL is higher than the first voltage level FVL. The second counter 24 is assigned to the second comparator 22 and is configured to be incremented once the input voltage level IVL is higher than the second voltage level SVL. The first counter 23 is configured to be incremented again after the input voltage level IVL being lower and higher again than the first voltage level FVL. The second counter 24 is configured to be incremented again after the input voltage level IVL being lower and higher again than the second voltage level SVL. The first counter 23 is configured to be incremented again once the second counter 24 was incremented twice without the first counter 23 being incremented in between.

The circuit arrangement 20 shown in FIG. 12 can be operated as described with FIGS. 3 and 4.

Figure 13:
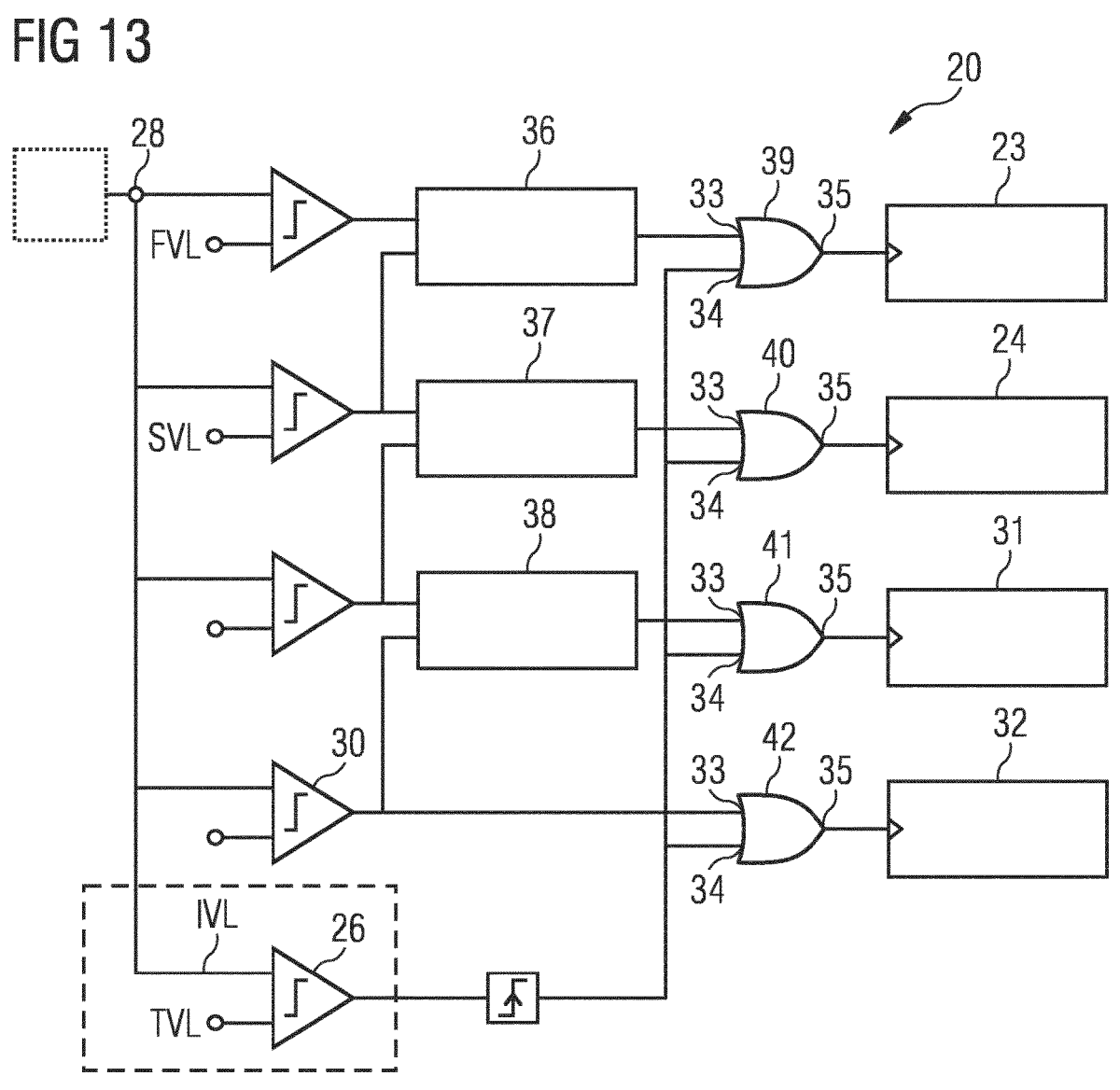

FIG. 13 shows another exemplary embodiment of the circuit arrangement 20. In comparison to the embodiment shown in FIG. 12, the circuit arrangement 20 also includes the pile-up comparator 26 that is connected with the input 28 and that is configured to compare the input voltage level IVL to the pile-up voltage level TVL. The voltage levels are all different and the pile-up voltage level TVL is the highest voltage level. The absolute value of the pile-up voltage level TVL is higher than the absolute value of the first voltage level FVL and the absolute value of the second voltage level SVL.

The circuit arrangement 20 further includes a first gate component 39 between the first overlap detection component 36 and the first counter 23. The first gate component 39 has a first input 33 that is connected with the first overlap detection component 36. The first gate component 39 has a second input 34 that is connected with the pile-up comparator 26. An output 35 of the first gate component 39 is connected with the first counter 23. The circuit arrangement 20 further includes a second gate component 40 between the second overlap detection component 37 and the second counter 24. The second gate component 40 has a first input 33 that is connected with the second overlap detection component 37. The second gate component 40 has a second input 34 that is connected with the pile-up comparator 26. An output 35 of the second gate component 40 is connected with the second counter 24. The circuit arrangement 20 further includes a third gate component 41 between the third overlap detection component 38 and the third counter 31. The third gate component 41 has a first input 33 that is connected with the third overlap detection component 38. The third gate component 41 has a second input 34 that is connected with the pile-up comparator 26. An output 35 of the third gate component 41 is connected with the third counter 31. The circuit arrangement 20 further includes a fourth gate component 42 between the fourth comparator 30 and the fourth counter 32. The fourth gate component 42 has a first input 33 that is connected with the fourth comparator 30. The fourth gate component 42 has a second input 34 that is connected with the pile-up comparator 26. An output 35 of the fourth gate component 42 is connected with the fourth counter 32. Thus, the first counter 23, the second counter 24, the third counter 31 and the fourth counter 32 are connected with the pile-up comparator 26. The first gate component 39, the second gate component 40, the third gate component 41 and the fourth gate component 42 can each be or include an OR gate.

The circuit arrangement 20 shown in FIG. 13 can be operated as described with FIG. 6.

Figure 14:
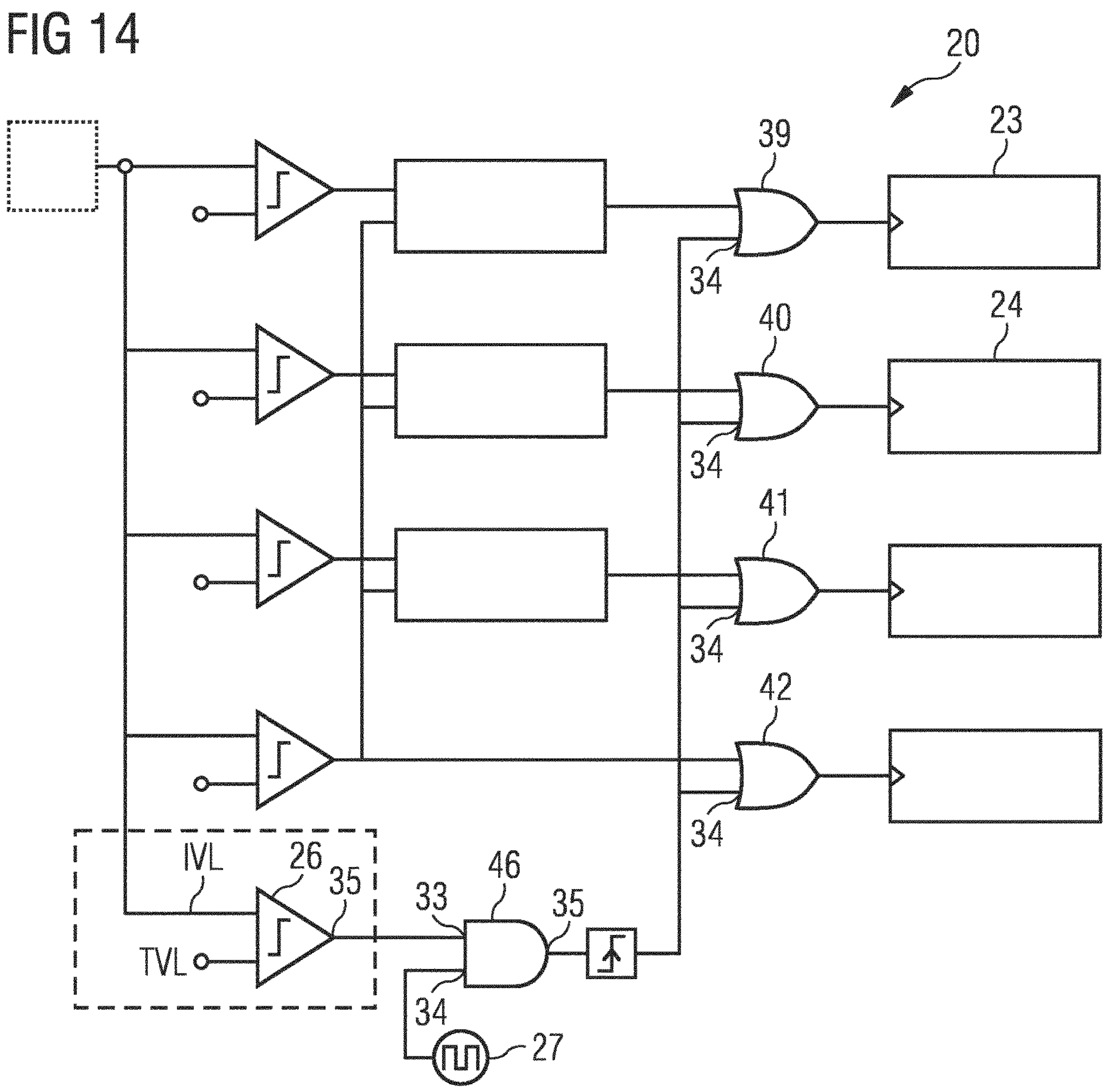

FIG. 14 shows another exemplary embodiment of the circuit arrangement 20. In comparison to the embodiment shown in FIG. 13, the circuit arrangement 20 also includes a main clock 27 running with a main clock frequency. The circuit arrangement 20 further includes a trigger generator 46 that is configured to generate a trigger signal at a set point in time during the period of the main clock 27 during the time that the input voltage level IVL is higher than the pile-up voltage level TVL. The trigger generator 46 has a first input 33 that is connected with an output 35 of the pile-up comparator 26. The trigger generator 46 has a second input 34 that is connected with the main clock 27. The trigger generator 46 has an output 35 that is connected with the second input 34 of the first gate component 39, the second input 34 of second gate component 40, the second input 34 of third gate component 41 and the second input 34 of fourth gate component 42.

The circuit arrangement 20 shown in FIG. 14 can be operated as described with FIG. 8 or as described with FIG. 10.

It is also possible that the main clock 27 includes a first clock running with a first clock frequency and a second clock running with a second clock frequency. In this case the first counter 23 is incremented each time at a set point in time during the period of the first clock during the time that the input voltage level IVL is higher than the pile-up voltage level TVL and the second counter 24 is incremented each time at a set point in time during the period of the second clock during the time that the input voltage level IVL is higher than the pile-up voltage level TVL.

REFERENCES

20 circuit arrangement
21 first comparator
22 second comparator
23 first counter
24 second counter
25 frontend circuit
26 pile-up comparator
27 main clock
28 input
29 third comparator
30 fourth comparator
31 third counter
32 fourth counter
33 first input
34 second input
35 output
36 first overlap detection component
37 second overlap detection component
38 third overlap detection component
39 first gate component
40 second gate component
41 third gate component
42 fourth gate component
43 photon detector
46 trigger generator
FVL first voltage level
FIVL fourth voltage level
FOVL third voltage level
IVL input voltage level
IVS input voltage signal
SVL second voltage level
TVL pile-up voltage level
S1-S4: states

The invention claimed is:

1. A method for operating a circuit arrangement, the method comprising:

receiving an input voltage signal with an input voltage level by at least one first comparator and by at least one second comparator;

comparing the input voltage level to a first voltage level by the first comparator;

comparing the input voltage level to a second voltage level by the second comparator;

incrementing a first counter assigned to the first comparator once the input voltage level is higher than the first voltage level;

incrementing the first counter again after the input voltage level being lower and higher again than the first voltage level;

incrementing a second counter assigned to the second comparator once the input voltage level is higher than the second voltage level;

incrementing the second counter again after the input voltage level being lower and higher again than the second voltage level; and incrementing the first counter by at least 1 again once the second counter was incremented twice without the first counter being incremented in between, wherein the absolute value of the first voltage level is lower than the absolute value of the second voltage level, wherein the input voltage signal is received by a pile-up comparator, the pile-up comparator compares the input voltage level to a pile-up voltage level and the absolute value of the pile-up voltage level is higher than the absolute value of the first voltage level and the absolute value of the second voltage level, wherein the first counter and the second counter are both incremented by at least 1 once the input voltage level is higher than the pile-up voltage level, and wherein the first counter and the second counter are incremented each time by at least 1 except for the first time at a set point in time during the period of a main clock running with a main clock frequency during the time that the input voltage level is higher than the pile-up voltage level.

2. The method for operating a circuit arrangement according to claim 1, wherein the first counter is incremented by at least 1 again each time once the second counter was incremented for the case that the second counter was incremented at least twice without the first counter being incremented in between.

3. The method for operating a circuit arrangement according to claim 1, wherein the input voltage signal is provided by a frontend circuit of a photon counting system, and the frontend circuit is configured to convert current pulses generated by a photon detector into voltage pulses forming the input voltage signal.

4. The method for operating a circuit arrangement according to claim 1, wherein the first counter is incremented by 1 once the input voltage level is higher than the first voltage level and the second counter is incremented by 1 once the input voltage level is higher than the second voltage level.

5. A method for operating a circuit arrangement, the method comprising:

receiving an input voltage signal with an input voltage level by at least one first comparator, by at least one second comparator and by at least one pile-up comparator;

comparing the input voltage level to a first voltage level by the first comparator;

comparing the input voltage level to a second voltage level by the second comparator;

comparing the input voltage level to a pile-up voltage level by the pile-up comparator;

incrementing a first counter assigned to the first comparator once the input voltage level is higher than the first voltage level;

incrementing a second counter assigned to the second comparator once the input voltage level is higher than the second voltage level; and incrementing the first counter and the second counter by at least 1 once the input voltage level is higher than the pile-up voltage level, wherein the absolute value of the first voltage level is lower than the absolute value of the second voltage level, and the absolute value of the pile-up voltage level is higher than the absolute value of the first voltage level and the absolute value of the second voltage level, wherein the input voltage signal is received by a pile-up comparator, the pile-up comparator compares the input voltage level to a pile-up voltage level and the absolute value of the pile-up voltage level is higher than the absolute value of the first voltage level and the absolute value of the second voltage level, and wherein the first counter and the second counter are incremented each time at a set point in time during the period of a main clock running with a main clock frequency during the time that the input voltage level is higher than the pile-up voltage level.

6. The method for operating a circuit arrangement according to claim 5, wherein the period of the main clock is equal to or longer than an expected pulse width of pulses of the input voltage signal.

7. A circuit arrangement comprising:

an input for receiving an input voltage signal with an input voltage level;

a first comparator that is connected with the input and that is configured to compare the input voltage level to a first voltage level;

a second comparator that is connected with the input and that is configured to compare the input voltage level to a second voltage level;

a first counter that is assigned to the first comparator and that is configured to be incremented once the input voltage level is higher than the first voltage level; and a second counter that is assigned to the second comparator and that is configured to be incremented once the input voltage level is higher than the second voltage level, wherein the first counter is configured to be incremented again after the input voltage level being lower and higher again than the first voltage level, the second counter is configured to be incremented again after the input voltage level being lower and higher again than the second voltage level, the first counter is configured to be incremented again once the second counter was incremented twice without the first counter being incremented in between, and the absolute value of the first voltage level is lower than the absolute value of the second voltage level, wherein the input voltage signal is received by a pile-up comparator, the pile-up comparator compares the input voltage level to a pile-up voltage level and the absolute value of the pile-up voltage level is higher than the absolute value of the first voltage level and the absolute value of the second voltage level, wherein the first counter and the second counter are both incremented by at least 1 once the input voltage level is higher than the pile-up voltage level, wherein the circuit arrangement comprises a pile-up comparator that is connected with the input and that is configured to compare the input voltage level to a pile-up voltage level, the absolute value of the pile-up voltage level is higher than the absolute value of the first voltage level and the absolute value of the second voltage level, and the first counter and the second counter are connected with the pile-up comparator, and wherein a main clock running with a main clock frequency and the pile-up comparator are connected with a trigger generator that is configured to generate a trigger signal at a set point in time during the period of the main clock during the time that the input voltage level is higher than the pile-up voltage level.

8. The circuit arrangement according to claim 7, wherein the first counter is connected with the second comparator.

* * * * *